(12) United States Patent
Lichtenwalner et al.

(10) Patent No.: US 12,087,854 B2
(45) Date of Patent: Sep. 10, 2024

(54) VERTICAL SEMICONDUCTOR DEVICE WITH IMPROVED RUGGEDNESS

(71) Applicant: Wolfspeed, Inc., Durham, NC (US)

(72) Inventors: Daniel Jenner Lichtenwalner, Raleigh, NC (US); Sei-Hyung Ryu, Cary, NC (US); Kijeong Han, Apex, NC (US); Edward Robert Van Brunt, Raleigh, NC (US)

(73) Assignee: Wolfspeed, Inc., Durham, NC (US)

( * ) Notice: Subject to any disclaimer, the term of this patent is extended or adjusted under 35 U.S.C. 154(b) by 0 days.

(21) Appl. No.: 17/929,858

(22) Filed: Sep. 6, 2022

(65) Prior Publication Data

US 2022/0416075 A1    Dec. 29, 2022

Related U.S. Application Data

(60) Division of application No. 16/938,032, filed on Jul. 24, 2020, now Pat. No. 11,489,069, which is a
(Continued)

(51) Int. Cl.
| | |
|---|---|
| *H01L 29/78* | (2006.01) |
| *H01L 21/04* | (2006.01) |
| *H01L 29/06* | (2006.01) |
| *H01L 29/08* | (2006.01) |
| *H01L 29/10* | (2006.01) |
| *H01L 29/16* | (2006.01) |

(Continued)

(52) U.S. Cl.
CPC ........ *H01L 29/7806* (2013.01); *H01L 21/046* (2013.01); *H01L 29/0619* (2013.01); *H01L 29/0878* (2013.01); *H01L 29/1095* (2013.01); *H01L 29/1608* (2013.01); *H01L 29/36* (2013.01); *H01L 29/6606* (2013.01); *H01L 29/66068* (2013.01); *H01L 29/66712* (2013.01); *H01L 29/7802* (2013.01); *H01L 29/861* (2013.01); *H01L 29/872* (2013.01)

(58) Field of Classification Search
None
See application file for complete search history.

(56) References Cited

U.S. PATENT DOCUMENTS

| | | |
|---|---|---|
| 4,803,533 A | 2/1989 | Chang et al. |
| 5,136,349 A | 8/1992 | Yilmaz et al. |
| | (Continued) | |

FOREIGN PATENT DOCUMENTS

| | | |
|---|---|---|
| CN | 102832248 A | 12/2012 |
| EP | 1143526 A2 | 10/2001 |
| | (Continued) | |

OTHER PUBLICATIONS

"Definition of a Random Number," Oxford English Dictionary, Available online at: <<https://en.oxforddictionaries.com/definition/random_number>, Accessed May 25, 2018.
(Continued)

*Primary Examiner* — Long Pham
(74) *Attorney, Agent, or Firm* — Myers Bigel, P.A.

(57) ABSTRACT

A vertical semiconductor device includes one or more of a substrate, a buffer layer over the substrate, one or more drift layers over the buffer layer, and a spreading layer over the one or more drift layers.

28 Claims, 19 Drawing Sheets

Related U.S. Application Data continuation-in-part of application No. 16/801,260, filed on Feb. 26, 2020, now Pat. No. 11,417,760, which is a continuation of application No. 15/849,922, filed on Dec. 21, 2017, now Pat. No. 10,615,274.

(51) Int. Cl.
*H01L 29/36* (2006.01)
*H01L 29/66* (2006.01)
*H01L 29/861* (2006.01)
*H01L 29/872* (2006.01)

(56) References Cited

U.S. PATENT DOCUMENTS

| | | | |
|---|---|---|---|
| 5,661,314 | A | 8/1997 | Merrill et al. |
| 5,665,987 | A | 9/1997 | Muraoka et al. |
| 5,783,474 | A | 7/1998 | Ajit |
| 5,844,259 | A | 12/1998 | Kinzer et al. |
| 5,915,179 | A | 6/1999 | Etou et al. |
| 6,031,265 | A | 2/2000 | Hshieh |
| 6,084,268 | A | 7/2000 | De et al. |
| 6,169,300 | B1 | 1/2001 | Fragapane |
| 6,184,555 | B1 | 2/2001 | Tihanyi et al. |
| 6,198,129 | B1 | 3/2001 | Murakami |
| 6,573,534 | B1 | 6/2003 | Kumar et al. |
| 6,847,091 | B2 | 1/2005 | Deboy et al. |
| 6,977,414 | B2 | 12/2005 | Nakamura et al. |
| 7,795,691 | B2 | 9/2010 | Zhang et al. |
| 7,989,882 | B2 | 8/2011 | Zhang et al. |
| 8,211,770 | B2 | 7/2012 | Zhang et al. |
| 8,232,558 | B2 | 7/2012 | Zhang et al. |
| 8,829,533 | B2 | 9/2014 | Domeij |
| 9,472,405 | B2 | 10/2016 | Nakano |
| 9,530,844 | B2 | 12/2016 | Zhang et al. |
| 10,256,294 | B2 * | 4/2019 | Pilla .................. H01L 29/205 |
| 11,769,827 | B2 * | 9/2023 | Han .................. H01L 29/1608 |
| | | | 257/77 |
| 2001/0020732 | A1 | 9/2001 | Deboy et al. |
| 2003/0020136 | A1 | 1/2003 | Kitabatake et al. |
| 2003/0073270 | A1 | 4/2003 | Hisada et al. |
| 2003/0235942 | A1 | 12/2003 | Nakamura et al. |
| 2004/0119076 | A1 | 6/2004 | Ryu |
| 2006/0102908 | A1 | 5/2006 | Mai et al. |
| 2006/0226494 | A1 | 10/2006 | Hshieh |
| 2006/0267091 | A1 | 11/2006 | Takahashi |
| 2007/0278571 | A1 | 12/2007 | Bhalla et al. |
| 2008/0042172 | A1 | 2/2008 | Hirler et al. |
| 2008/0157117 | A1 | 7/2008 | McNutt et al. |
| 2008/0296771 | A1 | 12/2008 | Das et al. |
| 2009/0134405 | A1 | 5/2009 | Ota et al. |
| 2009/0302328 | A1 | 12/2009 | Ohno et al. |
| 2010/0100931 | A1 | 4/2010 | Novack et al. |
| 2010/0140628 | A1 | 6/2010 | Zhang |
| 2010/0200931 | A1 | 8/2010 | Matocha et al. |
| 2010/0295060 | A1 | 11/2010 | Kudou et al. |
| 2010/0301335 | A1 * | 12/2010 | Ryu .................. H01L 29/0839 |
| | | | 257/77 |
| 2011/0006407 | A1 | 1/2011 | Hirler |
| 2011/0049564 | A1 | 3/2011 | Guan et al. |
| 2011/0057202 | A1 | 3/2011 | Kono et al. |
| 2011/0101375 | A1 | 5/2011 | Zhang |
| 2011/0306175 | A1 | 12/2011 | Hebert et al. |
| 2012/0049902 | A1 | 3/2012 | Corona et al. |
| 2012/0241766 | A1 | 9/2012 | Ohtsuka et al. |
| 2012/0292742 | A1 | 11/2012 | Itoh et al. |
| 2013/0092978 | A1 | 4/2013 | Sugawara et al. |
| 2014/0183552 | A1 | 7/2014 | Zhang et al. |
| 2014/0183553 | A1 | 7/2014 | Zhang et al. |
| 2014/0284621 | A1 | 9/2014 | Shimizu et al. |
| 2015/0014742 | A1 | 1/2015 | Lu |
| 2015/0263145 | A1 * | 9/2015 | Pala .................. H01L 29/66333 |
| | | | 257/77 |
| 2015/0311325 | A1 * | 10/2015 | Zhang .................. H01L 29/66333 |
| | | | 257/77 |
| 2016/0056306 | A1 | 2/2016 | Masuoka et al. |
| 2017/0053987 | A1 | 2/2017 | Zhang et al. |
| 2018/0108789 | A1 | 4/2018 | Vobecky |
| 2018/0190651 | A1 | 7/2018 | Siemieniec et al. |
| 2019/0198659 | A1 | 6/2019 | Lichtenwalner et al. |

FOREIGN PATENT DOCUMENTS

| | | |
|---|---|---|
| EP | 1429392 A2 | 6/2004 |
| EP | 1737042 A1 | 12/2006 |
| EP | 1965432 A1 | 9/2008 |
| EP | 2068363 A2 | 6/2009 |
| EP | 2581939 A2 | 4/2013 |
| GB | 2033658 A | 5/1980 |
| GB | 2243952 A | 11/1991 |
| JP | S60196975 A | 10/1985 |
| JP | H03142972 A | 6/1991 |
| JP | H04239778 A | 8/1992 |
| JP | H0778978 A | 3/1995 |
| JP | H10308510 A | 11/1998 |
| JP | H11330091 A | 11/1999 |
| JP | 2000319099 A | 11/2000 |
| JP | 2004193578 A | 7/2004 |
| JP | 2005191241 A | 7/2005 |
| JP | 2009158788 A | 7/2009 |
| JP | 2011258635 A | 12/2011 |
| JP | 2012235002 A | 11/2012 |
| JP | 2012243966 A | 12/2012 |
| JP | 2013089700 A | 5/2013 |
| JP | 2014022708 A | 2/2014 |
| KR | 20140033078 A | 3/2014 |
| WO | 2012105611 A1 | 8/2012 |
| WO | 2014013821 A1 | 1/2014 |
| WO | 2015115202 A1 | 8/2015 |
| WO | 2017199792 A1 | 11/2017 |
| WO | 2020002653 A1 | 1/2020 |

OTHER PUBLICATIONS

"Decision of Refusal for European Patent Application No. 13806028.0, dated Apr. 18, 2019, 8 pages".

"Decision of Rejection for Japanese Patent Application No. 2015-550411, dated Sep. 12, 2017, 10 pages".

"Decision of Rejection for Japanese Patent Application No. 2016-557300, dated Apr. 9, 2019, 6 pages".

"Decision to Grant a Patent for Japanese Patent Application No. 2015-550412, dated Jan. 8, 2019, 4 pages".

"Examination Report for European Patent Application No. 13806028.0 dated Mar. 6, 2018, 7 pages".

"Examination Report for European Patent Application No. 13811320.4 dated Feb. 2, 2018, 4 pages".

"Examination Report for European Patent Application No. 13811320.4, dated Oct. 22, 2019, 6 pages".

"Examination Report for European Patent Application No. 15745260.8, dated Jun. 24, 2019, 11 pages".

"Examination Report for European Patent Application No. 18840110.3 dated Sep. 13, 2021, 6 pages".

"First Office Action and Search Report for Chinese Patent Application No. 201380068265.9, dated Mar. 13, 2017, 24 pages".

"International Preliminary Report on Patentability for International Patent Application No. PCTUS15011015, dated Sep. 22, 2016, 11 pages".

"International Preliminary Report on Patentability for International Patent Application No. PCTUS18065101, dated Jul. 2, 2020, 7 pages".

"International Preliminary Report on Patentability in corresponding patent application No. PCTUS13073093 dated Jul. 9, 2015, 11 pages".

"International Preliminary Report on Patentability in corresponding patent application PCTUS13073092 dated Jul. 9, 2015, 9 pages".

"International Search Report and Written Opinion for International Application PCTUS13073092 dated Feb. 17, 2014, 14 pages".

"International Search Report and Written Opinion for International Application PCTUS13073093 dated Apr. 1, 2014, 15 pages".

(56) References Cited

OTHER PUBLICATIONS

"International Search Report and Written Opinion for International Application PCTUS15011015 dated Sep. 30, 2015, 15 pages".
"International Search Report and Written Opinion for International Patent Application No. PCTUS18065101, dated Mar. 20, 2019, 12 pages".
"International Search Report and Written Opinion for International Patent Application No. PCTUS21041532, dated Jan. 13, 2022, 18 pages".
"Invitation to Pay Additional Fees and Partial Search for International Application No. PCTUS21041532, dated Nov. 2, 2021, 11 pages".
"Notice of Allowance for Korean Patent Application No. 10-2015-7020113, dated Feb. 4, 2017, 4 pages".
"Notice of Completion of Pretrial Examination for Japanese Patent Application No. 2015-550411, dated Feb. 1, 2018, 4 pages".
"Notice of Preliminary Rejection in Korean Patent Application No. 10-2015-7020113 dated Jun. 27, 2016, 22 pages".
"Notice of Reasons for Rejection for Japanese Patent Application No. 2015-550411, dated May 9, 2017, 19 pages".
"Notice of Reasons for Rejection for Japanese Patent Application No. 2015-550412, dated Nov. 21, 2017, 9 pages".
"Notice of Reasons for Rejection for Japanese Patent Application No. 2015-550412, dated May 15, 2018, 13 pages".
"Notice of Reasons for Rejection for Japanese Patent Application No. 2016-55730, dated Jun. 2, 2020, 15 pages".
"Notice of Termination of Reconsideration by Examiners before Appeal Proceedings for Japanese Patent Applicaiton No. 2016-557300, mailed Oct. 23, 2019, 3 pages".
"Notification of Reasons for Refusal for Japanese Patent Application No. 2016-557300, dated Sep. 11, 2018. 9 pages".
"Pretrial Report for Japanese Patent Application No. 2016-557300, mailed Oct. 4, 2019, 11 pages".
"Proposed Claim Amendments for Examiner Initiated Telephone Message for Chinese Patent Application No. 201380068265.9, mailed Oct. 30, 2018, 5 pages".
"Report of Reconsideration by Examiner before Appeal for Japanese Patent Application No. 2015-550411, dated Feb. 1, 2018, 6 pages".
"Result of Consultation for European Patent Application No. 13806028. 1, mailed Mar. 14, 2019, 3 pages".
"Second Office Action for Chinese Patent Application No. 201380068265.9, dated Nov. 29, 2017, 14 pages".
"Summons to Attend Oral Proceedings for European Patent Application No. 13806028.0, dated Oct. 30, 2018, 6 pages".
"Summons to Attend Oral Proceedings for European Patent Application No. 13811320.4, mailed May 12, 2020, 5 pages".
"Third Office Action for Chinese Patent Application No. 201380068265. 9, dated Aug. 10, 2018, 24 pages".
"Trial and Appeal Decision for Japanese Patent Application No. 2015-550411, mailed Jul. 2, 2019, 35 pages".
Akturk, A., et al., "Single event effects in Si and SiC power MOSFETs due to terrestrial neutrons", IEEE Transactions on Nuclear Science, 64(1), 2017, 529-535.
Konstantinov, A., et al., "Investigation of lo-hi-lo and delta-doped silicon carbide structures", Materials Research Society, 6 pages.
Liu, Sandra, et al., "Effect of buffer layer on single-event burnout of power DMOSFETs", IEEE Transactions on Nuclear Science, 54(6), 2007, 2554-2560.
Liu, Sandra, et al., "Single-event burnout and avalanche characteristics of power DMOSFETs", IEEE Transactions on Nuclear Science, 53(6), 2006, 3379-3385.
Normand, Eugene, et al., "Neutron-induced single event burnout in high voltage electronics", IEEE Transactions on Nuclear Science, 44(6), 1997, 2358-2366.
Tamaki, Tomohiro, et al., "Optimization of ON-State and Switching Performances for 15-20-kV 4H-Sic IGBTs", IEEE transactions on electron devices, 55(8), 2008, 1920-1927.
Zeller, H.R., "Cosmic ray induced failures in high power semiconductor devices", Solid-State Electronics, 38(12), 1995, 2041-2046.
"International Preliminary Report on Patentability for International Patent Application No. PCTUS21041532, dated Feb. 2, 2023, 10 pages".
"European Search Report in Corresponding Patent Application No. 23151813.5, mailed Jun. 6, 2023, 9 pages".

* cited by examiner

VERTICAL SEMICONDUCTOR DEVICE WITH IMPROVED RUGGEDNESS

This application is a division of U.S. patent application Ser. No. 16/938,032, filed Jul. 24, 2020, which is a continuation-in-part of U.S. patent application Ser. No. 16/801,260, filed Feb. 26, 2020, now U.S. Pat. No. 11,417,760, which is a continuation of U.S. patent application Ser. No. 15/849,922, filed Dec. 21, 2017, now U.S. Pat. No. 10,615,274, the disclosures of which are incorporated herein by reference in their entireties.

FIELD OF THE DISCLOSURE

The present disclosure relates to vertical semiconductor devices, and in particular to vertical semiconductor devices for power applications with improved ruggedness due to increased radiation tolerance.

BACKGROUND

Vertical semiconductor devices come in several varieties, each of which may be used for different applications. One notable use of vertical semiconductor devices is for high power applications. In particular, devices such as PiN diodes, Schottky diodes, and vertical metal-oxide semiconductor field-effect transistors (MOSFETs) may be rated for high blocking voltages and thus are often used for these power applications. For purposes of illustration, FIG. 1 shows the general structure of a conventional vertical semiconductor device 10. The conventional vertical semiconductor device 10 includes a substrate 12 and a drift layer 14 over the substrate 12. A graph shows the relative doping concentrations for the substrate 12 and the drift layer 14. As shown, the substrate 12 is much more heavily doped than the drift layer 14. Implanted regions, additional semiconductor layers, and/or metal layers may be added to the conventional vertical semiconductor device 10 to provide a PiN diode, a Schottky diode, a MOSFET, or any other type of device. When finished, the conventional vertical semiconductor device 10 may provide a high blocking voltage and thus may be useful for high power applications as discussed above. However, the conventional vertical semiconductor device 10 may be subject to failure at high blocking voltages due to radiation intolerance.

SUMMARY

The present disclosure relates to vertical semiconductor devices, and in particular to vertical semiconductor devices for power applications with improved ruggedness due to increased radiation tolerance.

For a first embodiment, a vertical semiconductor device has a substrate, a buffer layer, a drift layer, and a spreading layer. The substrate has a first doping type. The buffer layer is over the substrate and has the first doping type. The drift layer is over the buffer layer and has the first doping type. The spreading layer is over the drift layer and has the first doping type, wherein the substrate, the buffer layer, and the drift layer are formed from silicon carbide.

The doping concentration of the buffer layer can be at least ten times a doping concentration of the drift layer; between ten and thirty times a doping concentration of the drift layer, or between fifteen and twenty-five times a doping concentration of the drift layer.

A thickness of the buffer layer can be between ten and thirty percent of a thickness of the drift layer or between fifteen and twenty-five percent of a thickness of the drift layer. For example, the doping concentration of the buffer layer may be between ten and thirty times a doping concentration of the drift layer, while the thickness of the buffer layer is between ten and thirty percent of a thickness of the drift layer. Or, the doping concentration of the buffer layer may be between fifteen and twenty-five times the doping concentration of the drift layer, and the thickness of the buffer layer may be between fifteen and twenty-five percent of a thickness of the drift layer.

The spreading layer may have a doping concentration between two and one thousand times that of the doping concentration of the drift layer. The buffer layer and the drift layer may be uniformly doped in certain configurations while the thickness of the spreading layer is less than a thickness of the drift layer.

In one configuration, a doping concentration of the drift layer is between $1 \times 10^{13}$ cm$^{-3}$ and $1 \times 10^{17}$ cm$^{-3}$ and a thickness of the drift layer is between one and four micrometers. A doping concentration of the buffer layer may be between $1 \times 10^{17}$ cm$^{-3}$ and $5 \times 10^{18}$ cm$^{-3}$.

For a second embodiment, a vertical semiconductor device has a substrate, a buffer layer, first and second drift layers, and a spreading layer formed from silicon carbide. A substrate has a first doping type. The first drift layer and the second drift layer are over the substrate and have the first doping type, wherein the second drift layer is between the first drift layer and the substrate. The spreading layer is over the first drift layer and has the first doping type.

In one configuration, a doping concentration for the second drift layer is higher than a doping concentration for the first drift layer. For example, the doping concentration for the second drift layer may be between 1.1 and 3 times a doping concentration for the first drift layer. The thickness of the second drift layer may be less than the thickness of the first drift layer. For example, the doping concentrations of the first drift layer and the second drift layer may be between $1 \times 10^{13}$ cm$^{-3}$ and $1 \times 10^{17}$ cm$^{-3}$, the thickness of the first drift layer may be between 2 and 50 micrometers, and a thickness of the second drift layer may be between 1 and 30 micrometers. In this embodiment, the buffer layer may not be provided between the substrate and either of the first drift layer or the second drift layer.

For a third embodiment, a vertical semiconductor device has a substrate, a buffer layer, a drift layer, and a spreading layer formed from silicon carbide. The substrate has a first doping type. The buffer layer is over the substrate and has the first doping type. A first drift layer and a second drift layer are over the buffer layer and have the first doping type, wherein the second drift layer is between the first drift layer and the substrate. The spreading layer is over the first drift layer and has the first doping type.

In one configuration, a doping concentration for the second drift layer is higher than a doping concentration for the first drift layer. The doping concentration for the second drift layer may higher than the doping concentration for the first drift layer, and the thickness of the second drift layer may be less than the thickness of the first drift layer. For example, the doping concentration for the second drift layer is between 1.1 and 3 times the doping concentration for the first drift layer. The doping concentration of the buffer layer may be at least ten times an average doping concentration of the first drift layer and the second drift layer or between ten and thirty times an average doping concentration of the first drift layer and the second drift layer. The thickness of the buffer layer may be between ten and thirty percent of a combined thickness of the first drift layer and the second drift layer.

In one configuration, the doping concentration of the buffer layer is between ten and thirty times a doping concentration of the drift layer, and the thickness of the buffer layer is between ten and thirty percent of a thickness of the drift layer. The spreading layer may have a doping concentration between two and one thousand times that of the doping concentration of the drift layer. The buffer layer and the drift layer may both be uniformly doped or doped in a graded fashion. The thickness of the spreading layer may be less than a combined thickness of the first drift layer and the second drift layer.

The doping concentrations of the first drift layer and the second drift layer may be between $1 \times 10^{13}$ cm$^{-3}$ and $1 \times 10^{17}$ cm$^{-3}$, the thickness of the first drift layer may be between 2 and 50 micrometers, and the thickness of the second drift layer may be between 1 and 30 micrometers, in one configuration. The doping concentration of the buffer layer may be between $1 \times 10^{17}$ cm$^{-3}$ and $5 \times 10^{18}$ cm$^{-3}$.

For a fourth embodiment, the vertical semiconductor device has a substrate, a drift layer, and a spreading layer formed from silicon carbide. The substrate has a first doping type. The drift layer is over the substrate and has the first doping type and a graded doping profile. The spreading layer is over the drift layer and has the first doping type. The graded doping profile may increase continuously through the drift layer from the spreading layer to the substrate. The doping profile of the spreading layer may be graded or uniform throughout the spreading layer.

In one configuration, the maximum doping concentration of the spreading layer may be higher than a maximum doping concentration of the drift layer. The doping concentration of the substrate may be higher than the maximum doping concentration of the drift layer. The range of doping concentrations for the graded doping profile falls between $1 \times 10^{13}$ cm$^{-3}$ and $1 \times 10^{17}$ cm$^{-3}$. The thickness of the drift layer may be between one and four micrometers.

In one configuration, the graded doping profile increases continuously through the drift layer from the spreading layer to the substrate; the doping concentration of the spreading layer is uniform throughout the spreading layer; the maximum doping concentration of the spreading layer is higher than the maximum doping concentration of the drift layer; and there is no buffer layer between the substrate and the drift layer. The range of doping concentrations for the graded doping profile may fall between $1 \times 10^{13}$ cm$^{-3}$ and $1 \times 10^{17}$ cm$^{-3}$.

For a fifth embodiment, the vertical semiconductor device has a substrate, a buffer layer, a drift layer, and a spreading layer formed from silicon carbide. The substrate has a first doping type. The buffer layer is over the substrate and has the first doping type. The drift layer is over the buffer and has the first doping type and a graded doping profile. The spreading layer is over the drift layer and has the first doping type.

In one configuration, the graded doping profile may increase continuously through the drift layer from the spreading layer to the substrate. The doping profile of the spreading layer may be graded or uniform throughout the spreading layer. The maximum doping concentration of the spreading layer may be higher than a maximum doping concentration of the drift layer.

The doping concentration of the substrate may be higher than the doping concentration of the drift layer, wherein a range of doping concentrations for the graded doping profile may fall between $1 \times 10^{13}$ cm$^{-3}$ and $1 \times 10^{17}$ cm$^{-3}$. The thickness of the drift layer may be between one and four micrometers.

In one configuration, the graded doping profile increases continuously through the drift layer from the spreading layer to the substrate; the doping concentration of the spreading layer is uniform throughout the spreading layer; and the maximum doping concentration of the spreading layer is higher than the maximum doping concentration of the drift layer.

In one configuration, the graded doping profile increases continuously through the drift layer from the spreading layer to the substrate; a graded doping profile for the spreading layer decreases continuously through spreading layer from a top portion of the spreading layer to the drift layer; and a graded doping profile for the buffer layer increases continuously through the buffer layer from the spreading layer to the substrate. The maximum doping concentration of the spreading layer may be higher than the maximum doping concentration of the drift layer.

In another embodiment, a vertical semiconductor device includes a substrate, a buffer layer over the substrate, and a drift layer over the buffer layer. The substrate has a first doping type and a first doping concentration. The buffer layer has the first doping type and a second doping concentration that is less than the first doping concentration. The drift layer has the first doping type and a third doping concentration that is less than the second doping concentration. Providing the substrate, the buffer layer, and the drift layer in this manner increases the radiation tolerance of the vertical semiconductor device and thus increases the ruggedness thereof.

In yet another embodiment, a method includes the steps of providing a substrate, providing a buffer layer over the substrate, and providing a drift layer over the buffer layer. The substrate has a first doping type and a first doping concentration. The buffer layer has the first doping type and a second doping concentration that is less than the first doping concentration. The drift layer has the first doping type and a third doping concentration that is less than the second doping concentration. Providing the substrate, the buffer layer, and the drift layer in this manner increases the radiation tolerance of the vertical semiconductor device and thus increases the ruggedness thereof.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
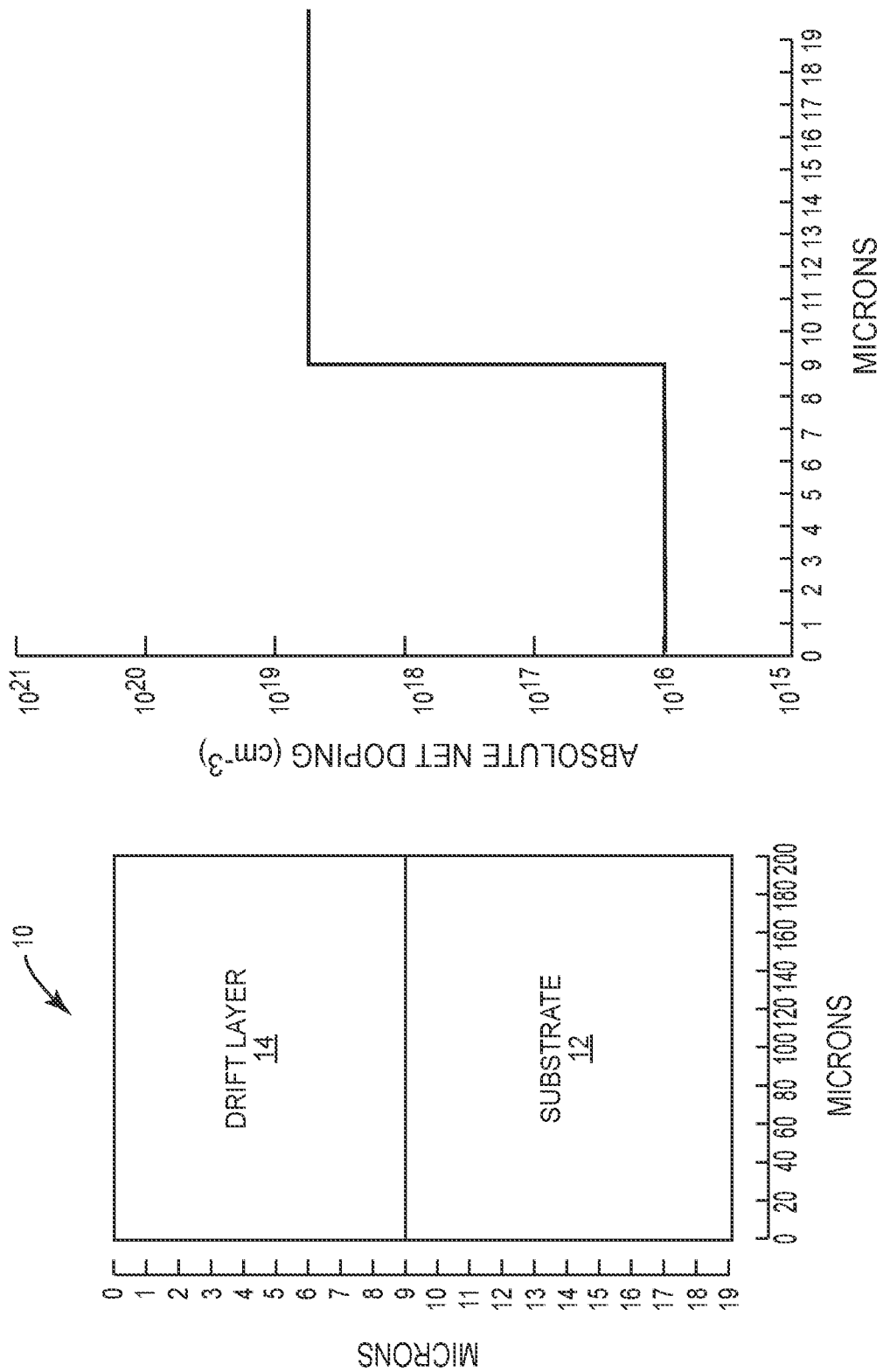
FIG. 1 illustrates a conventional vertical semiconductor device.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 2:
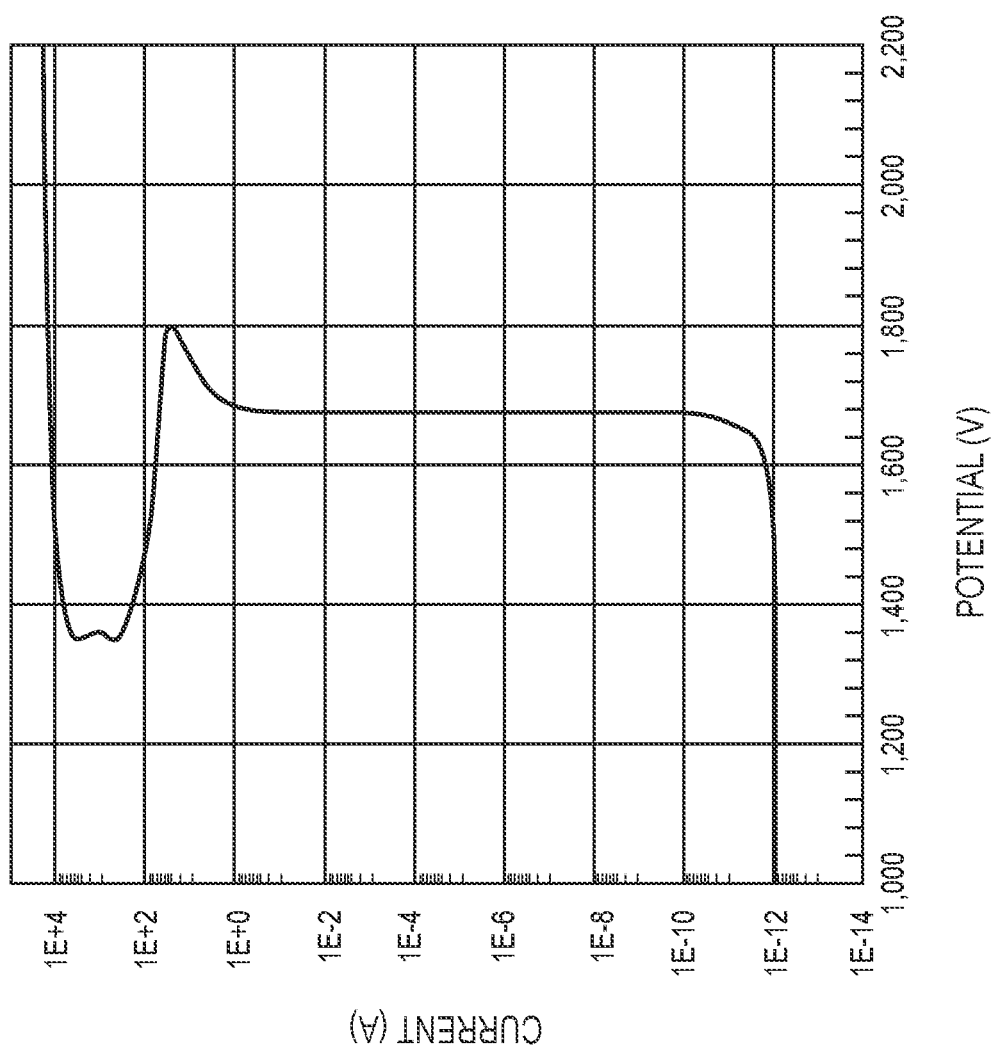
FIG. 2 is a graph illustrating the operating characteristics of a conventional vertical semiconductor device.

FIG. 2 is a graph illustrating an exemplary relationship between current through the conventional vertical semiconductor device 10 and voltage across the conventional vertical semiconductor device 10. As shown, the current through the device maintains relatively consistent leakage current at 1 pico-Amps for blocking voltages up to 1600 Volts (this graph is applicable to devices rated for blocking voltages up to 1200 Volts and forward currents up to 50 Amps, similar curves will show the same general characteristics for devices having other ratings). Above 1600 Volts, the conventional vertical semiconductor device 10 begins to experience avalanche breakdown, and the current through the device thus increases sharply. Above 1 Amps, the conventional vertical semiconductor device 10 experiences a second breakdown in which the current through the device continues to increase, and the voltage across the device decreases sharply. The extent to which the conventional vertical semiconductor device 10 experiences this second breakdown (i.e., the voltage at which second breakdown occurs) is proportional to the ability of the device to withstand radiation. This is because when operating at high voltages, radiation particles such as terrestrial neutrons or heavy ions may collide with charge particles in the device, knocking these charge particles loose and causing a cascade effect that results in the device "jumping" from the bottom portion of the curve shown in FIG. 2 to the top portion in which second breakdown occurs. If this occurs, the conventional vertical semiconductor device 10 will catastrophically fail.

Figure 3:
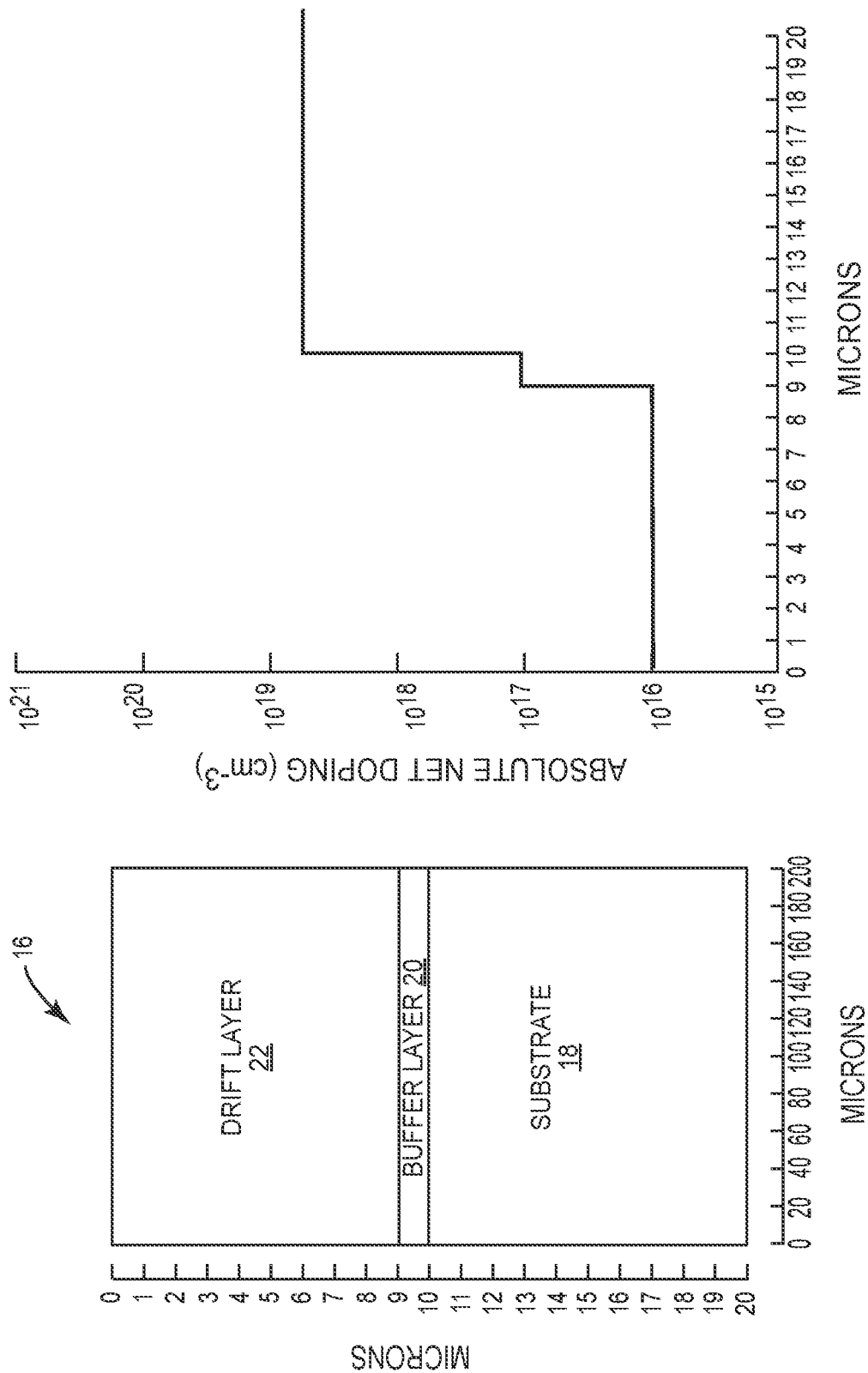
FIG. 3 illustrates a vertical semiconductor device according to one embodiment of the present disclosure.

In light of the above, there is a need for vertical semiconductors with improved radiation tolerance and thus increased ruggedness. Accordingly, FIG. 3 shows the basic structure of a vertical semiconductor device 16 according to one embodiment of the present disclosure. The vertical semiconductor device 16 includes a substrate 18, a buffer layer 20 over the substrate 18, and a drift layer 22 over the buffer layer 20. A graph shows the relative doping concentrations of the substrate 18, the buffer layer 20, and the drift layer 22. As shown, the substrate 18 is more heavily doped than the buffer layer 20, which is in turn more heavily doped than the drift layer 22. In particular, the substrate 18, the buffer layer 20, and the drift layer 22 are all doped in a relatively consistent manner and thus form a step doping profile as shown. Providing the buffer layer 20 with a doping concentration that is higher than the drift layer 22 but lower than the substrate 18 creates a buffer for charge particles that may be accelerated by collisions with radiated particles, allowing these accelerated charge particles to recombine instead of passing through the vertical semiconductor device 16.

Notably, the thickness and doping concentrations of the substrate 18, the buffer layer 20, and the drift layer 22 are merely exemplary. In particular, these thicknesses and doping concentrations are shown for a device rated for 1200 Volts. Those skilled in the art will readily appreciate that higher blocking voltages may dictate greater thicknesses for the drift layer 22, and in some embodiments, the buffer layer 20, and/or decreased doping concentrations for the same. However, the relationship between the thicknesses and doping concentrations of these layers will remain relatively unchanged. In one embodiment, a thickness of the buffer layer 20 may be between 5% and 35% the thickness of the drift layer 22. In specific embodiments, a thickness of the buffer layer 20 may be between 5% and 10% the thickness of the drift layer 22, between 10% and 15% the thickness of the drift layer 22, between 15% and 20% the thickness of the drift layer 22, between 20% and 25% the thickness of the drift layer, between 25% and 30% the thickness of the drift layer 22, between 30% and 35% the thickness of the drift layer 22, between 15% and 15% the thickness of the drift layer 22, and between 25% and 35% the thickness of the drift layer 22. Further, the doping concentration of the buffer layer 20 may vary between 20% and 90% the doping concentration of the substrate 18 while remaining greater than the doping concentration of the drift layer 22 by at least 20%. In specific embodiments, the doping concentration of the buffer layer 20 may be between 20% and 30% the doping concentration of the substrate 18, between 30% and 40% the doping concentration of the substrate 18, between 40% and 50% the doping concentration of the substrate 18, between 50% and 60% the doping concentration of the substrate 18, between 60% and 70% the doping concentration of the substrate 18, between 70% and 80% the doping concentration of the substrate 18, and between 80% and 90% the doping concentration of the substrate 18.

In one embodiment, the substrate 18, the buffer layer 20, and the drift layer 22 are silicon carbide (SiC). Accordingly, the buffer layer 20 may be an epitaxial layer that is grown on the substrate 18 before the drift layer 22. The drift layer 22 may then be grown over the buffer layer 20. The buffer layer 20 may be grown in an environment with dopants to provide the desired doping concentrations, or grown and subsequently implanted (e.g., via ion implantation) to the desired doping concentration. In other embodiments, the buffer layer 20 may be an implanted region in the surface of the substrate 18. Since the substrate 18 is more highly doped than the desired doping level for the buffer layer 20, the substrate 18 may be doped with an opposite doping type (e.g., if the substrate 18 is an n-type substrate, it may be doped with a p-dopant) to decrease the net doping concentration thereof. Notably, the principles of the present disclosure apply equally to n-type or p-type substrates, buffer layers, and drift layers. That is, the principles of the present disclosure may be equally applied to n-type and p-type devices.

Figure 4B:
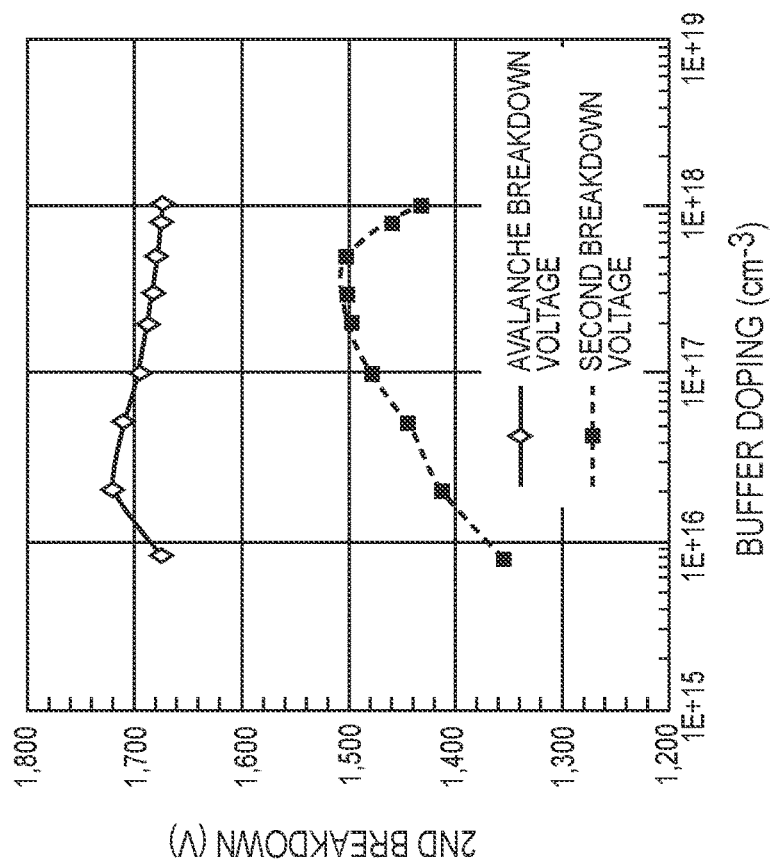
FIGS. 4A through 4C are graphs illustrating various operating characteristics of a vertical semiconductor device according to one embodiment of the present disclosure.
Figure 4A:
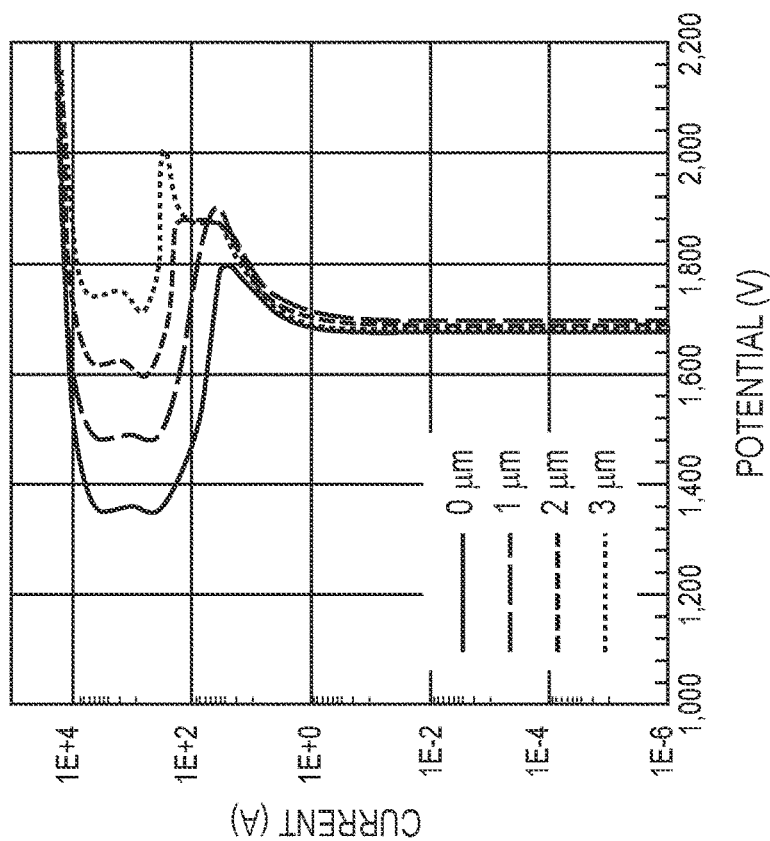

FIG. 4A is a graph illustrating the effect of the buffer layer 20 on the second breakdown of the vertical semiconductor device 16. In particular, FIG. 4A shows a relationship between current through the vertical semiconductor device 16 and voltage across the vertical semiconductor device 16 for several different thicknesses of the buffer layer 20 at a doping concentration of $10^{17}$ cm$^{-3}$. As shown, as the thickness of the buffer layer 20 increases, the voltage at which second breakdown occurs also increases. As defined herein, the second breakdown voltage is the lowest voltage at which the second breakdown occurs, and reflects the left-most point of the upper portion of the graph shown in FIG. 4A. Increasing the second breakdown voltage may significantly increase the radiation tolerance and thus ruggedness of the vertical semiconductor device 16. In one embodiment, the buffer layer 20 increases the second breakdown voltage such that it is greater than the avalanche voltage.

FIG. 4B is a graph illustrating the effect of the buffer layer 20 on both the avalanche breakdown voltage and the second breakdown voltage. In particular, FIG. 4B shows a relationship between the avalanche breakdown voltage and the second breakdown voltage to a doping concentration of the buffer layer 20 when the buffer layer is 1 µm thick. As shown, as the doping concentration of the buffer layer 20 increases, the second breakdown voltage similarly increases, up to a certain point, where it begins to decline rapidly. Notably, the doping concentration of the buffer layer 20 has a minimal effect on the avalanche breakdown voltage, and thus using the buffer layer 20 does not decrease the performance of the vertical semiconductor device 16.

Figure 4C:
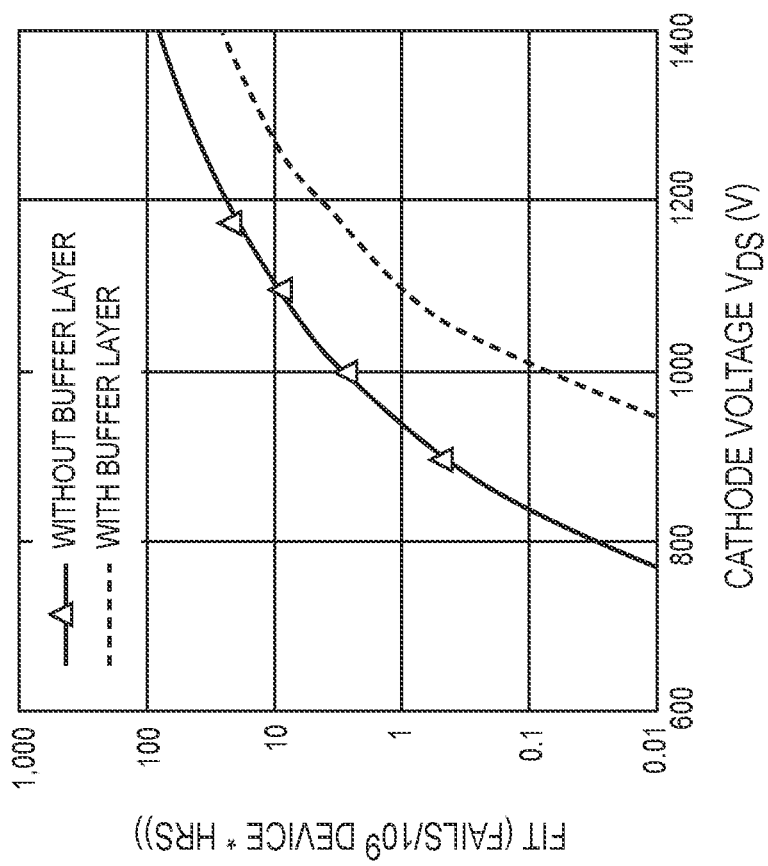

FIG. 4C is a graph illustrating the effect of the buffer layer 20 on the failure rate of the vertical semiconductor device 16. In particular, FIG. 4C shows a relationship between failure rate (as a function of device hours) and voltage across the device. A first line shows the failure rate for devices not including the buffer layer 20, while a second line shows the failure rate for devices including the buffer layer 20. As illustrated, the failure rate of devices including the buffer layer 20 is significantly lower for a given device voltage.

Figure 5:
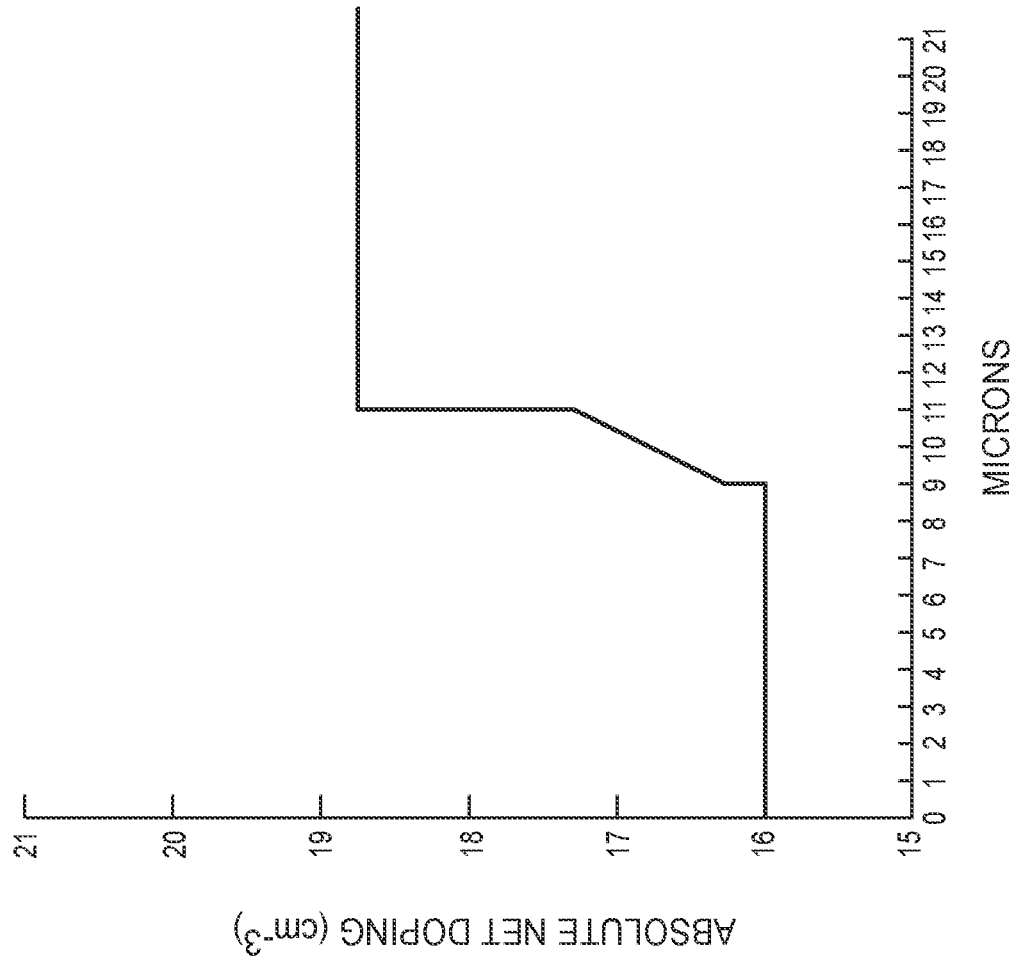
FIG. 5 illustrates a vertical semiconductor device according to one embodiment of the present disclosure.
Figure 5:
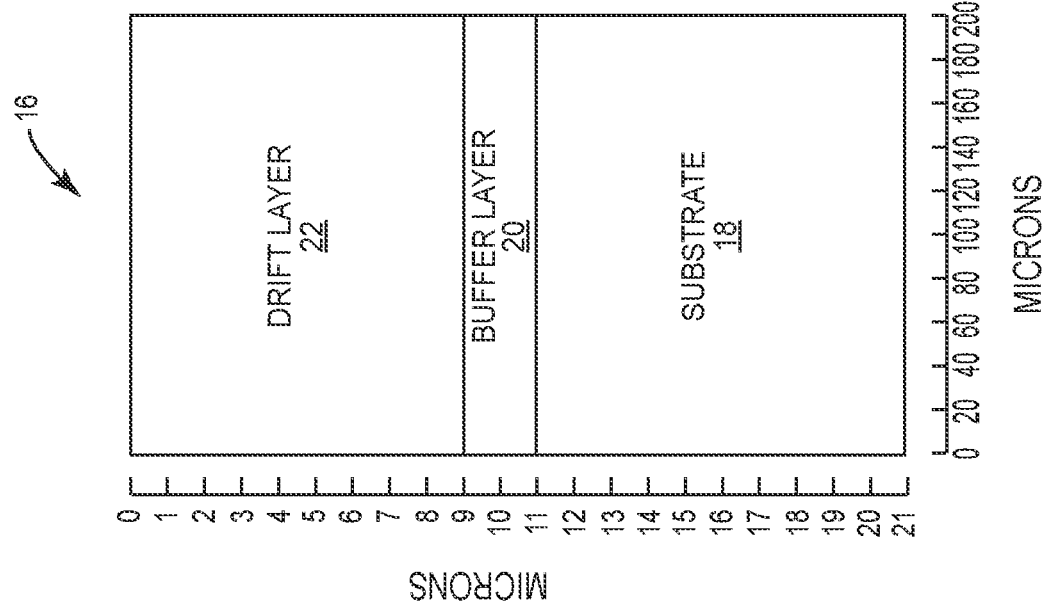

FIG. 5 shows the vertical semiconductor device 16 according to an additional embodiment of the present disclosure. The vertical semiconductor device 16 shown in FIG. 5 is substantially similar to that shown in FIG. 3, except for the doping profile of the device and the relative thicknesses of the layers. In particular, the buffer layer 20 provides a linearly graded doping concentration that decreases in proportion to a distance from the drift layer 22 such that the overall doping profile of the device includes a step between the drift layer 22 and the buffer layer 20 and another step between the buffer layer 20 and the substrate 18. In this embodiment, the buffer layer 20 may be thicker to allow for the linear transition in the doping profile thereof. Such a doping profile may be created by first growing the buffer layer 20 and then performing ion implantation on it, or by growing the buffer layer 20 in an environment wherein the concentration of dopants are controlled throughout the growth process. Notably, this doping profile is merely exemplary, and any linearly graded doping concentration may be substituted for the one shown in FIG. 5 without departing from the principles of the present disclosure.

Figure 6:
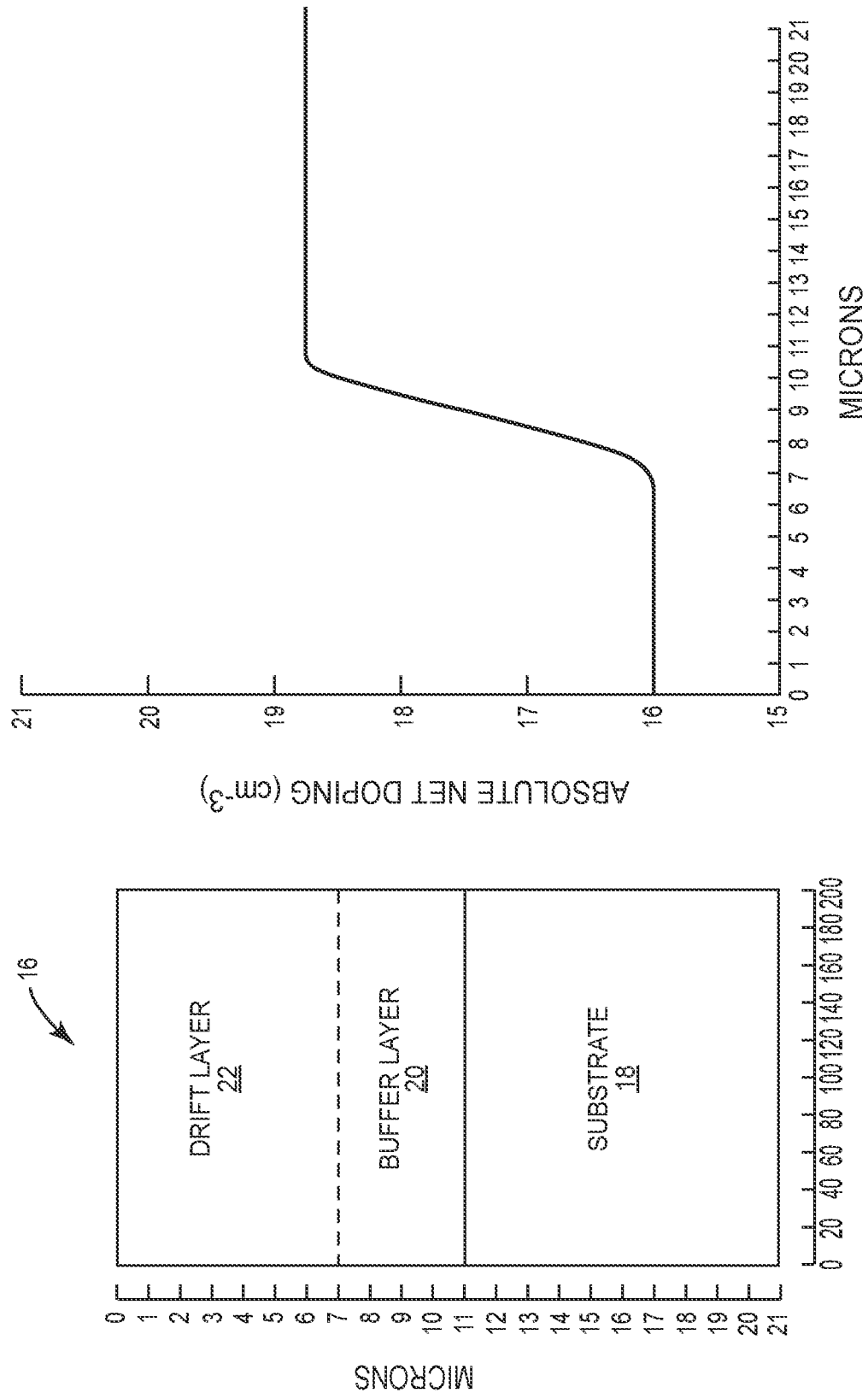
FIG. 6 illustrates a vertical semiconductor device according to one embodiment of the present disclosure.

FIG. 6 shows the vertical semiconductor device 16 according to an additional embodiment of the present disclosure. The vertical semiconductor device 16 shown in FIG. 6 is substantially similar to that shown in FIG. 3 except for the doping profile of the device and the relative thicknesses of the layers. In particular, the buffer layer 20 provides a substantially smooth transition between the doping concentration of the drift layer 22 and the doping concentration of the substrate 18. In this embodiment, the buffer layer 20 may be substantially thicker to allow for the transition in the doping profile thereof. Such a doping profile may be created by first growing the buffer layer 20 and then performing ion implantation on it, or by growing the buffer layer 20 in an environment wherein the concentration of dopants are controlled throughout the growth process. Notably, this doping profile is merely exemplary, and any graded doping concentration, linear or otherwise, may be substituted for the one shown in FIG. 6 without departing from the principles of the present disclosure.

Figure 7:
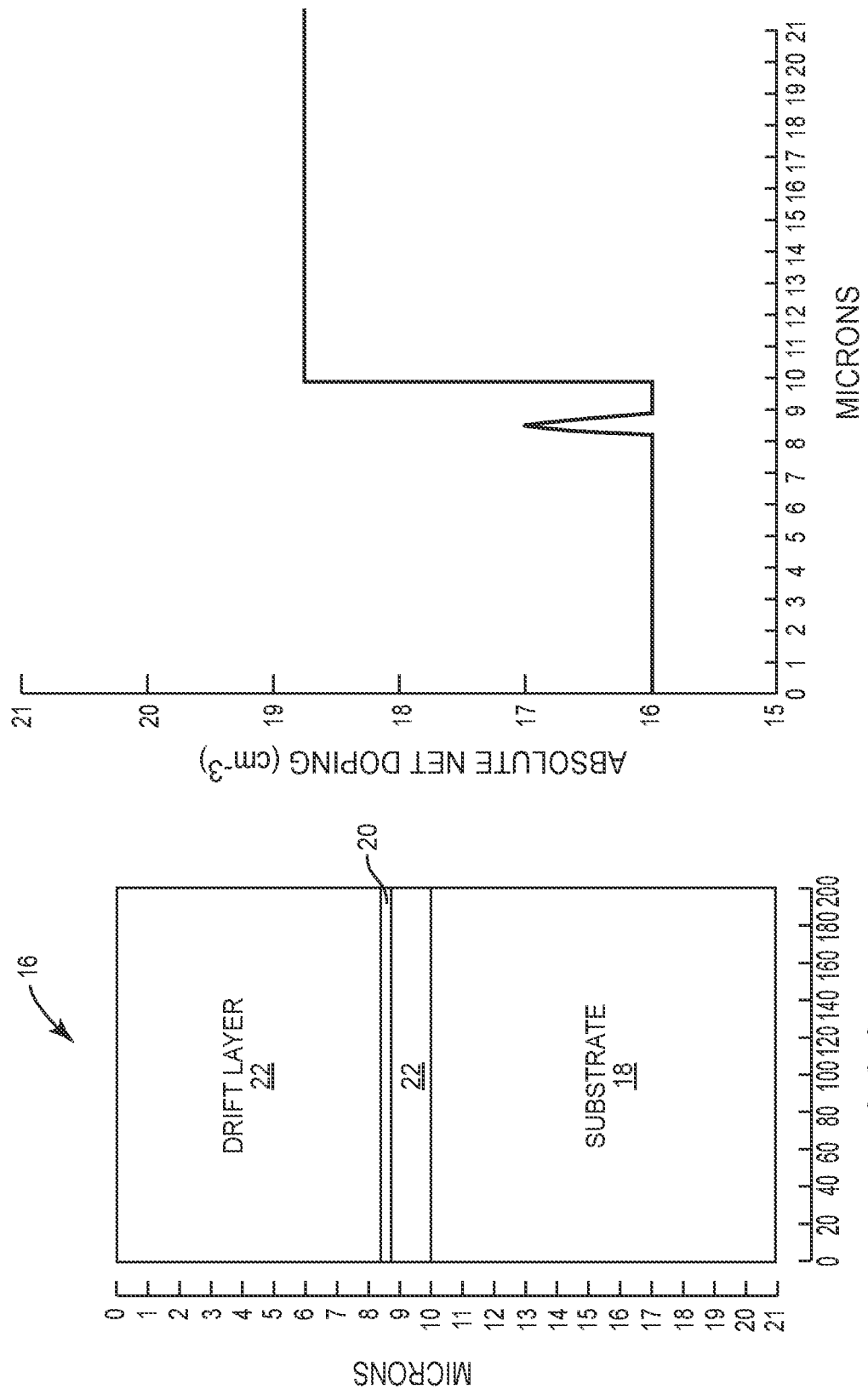
FIG. 7 illustrates a vertical semiconductor device according to one embodiment of the present disclosure.

FIG. 7 shows the vertical semiconductor device 16 according to an additional embodiment of the present disclosure. The vertical semiconductor device 16 shown in FIG. 7 is substantially similar to that shown in FIG. 3 except for the doping profile of the device and the relative thicknesses of the layers. In particular, the buffer layer 20 is provided as a doping "spike" and is not directly over the substrate 18. In this embodiment, the buffer layer 20 may be reduced in thickness. Such a doping profile may be formed either via separate growth on top of a small portion of the drift layer 22 or by growing a small portion of the drift layer 22, performing ion implantation to create the buffer layer 20, then growing the rest of the drift layer 22. Notably, this doping profile is merely exemplary, and any "spike" doping profile may be substituted for the one shown in FIG. 7 without departing from the principles of the present disclosure.

Figure 8:
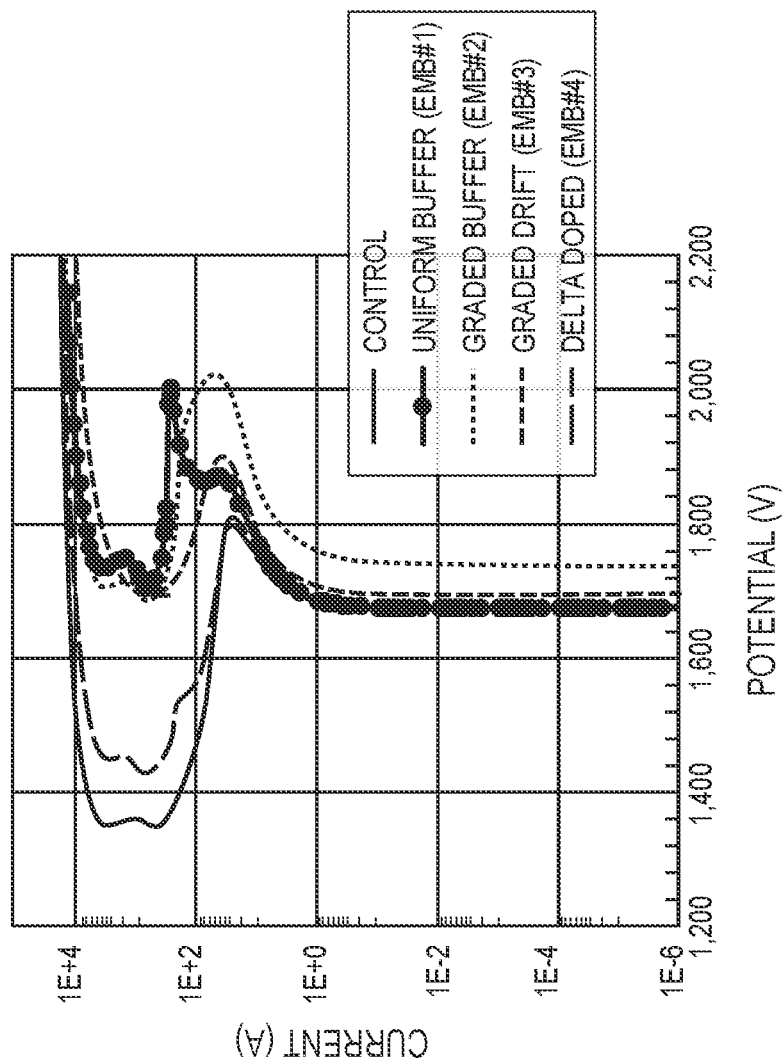
FIG. 8 is a graph illustrating the operating characteristics of vertical semiconductor devices according to various embodiments of the present disclosure.

FIG. 8 shows the effect of the buffer layer 20 for the embodiments shown in FIGS. 3, 5, 6 and 7 on the second breakdown of the vertical semiconductor device 16. As shown, the buffer layer 20 significantly increases the second breakdown voltage for each embodiment when compared to a conventional vertical semiconductor device not including the buffer layer 20. As discussed above, this results in a significantly increased radiation tolerance and thus improved ruggedness of the vertical semiconductor device 16.

Figure 9:
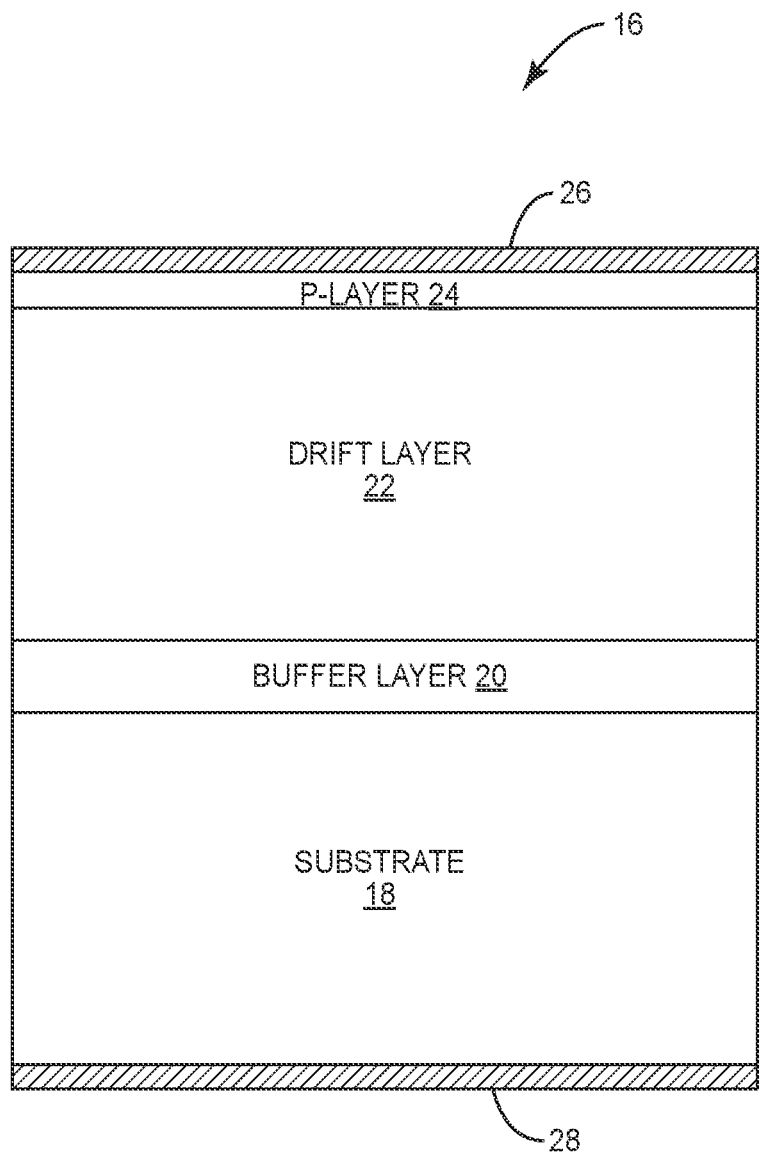
FIG. 9 illustrates a PiN diode according to one embodiment of the present disclosure.
Figure 10:
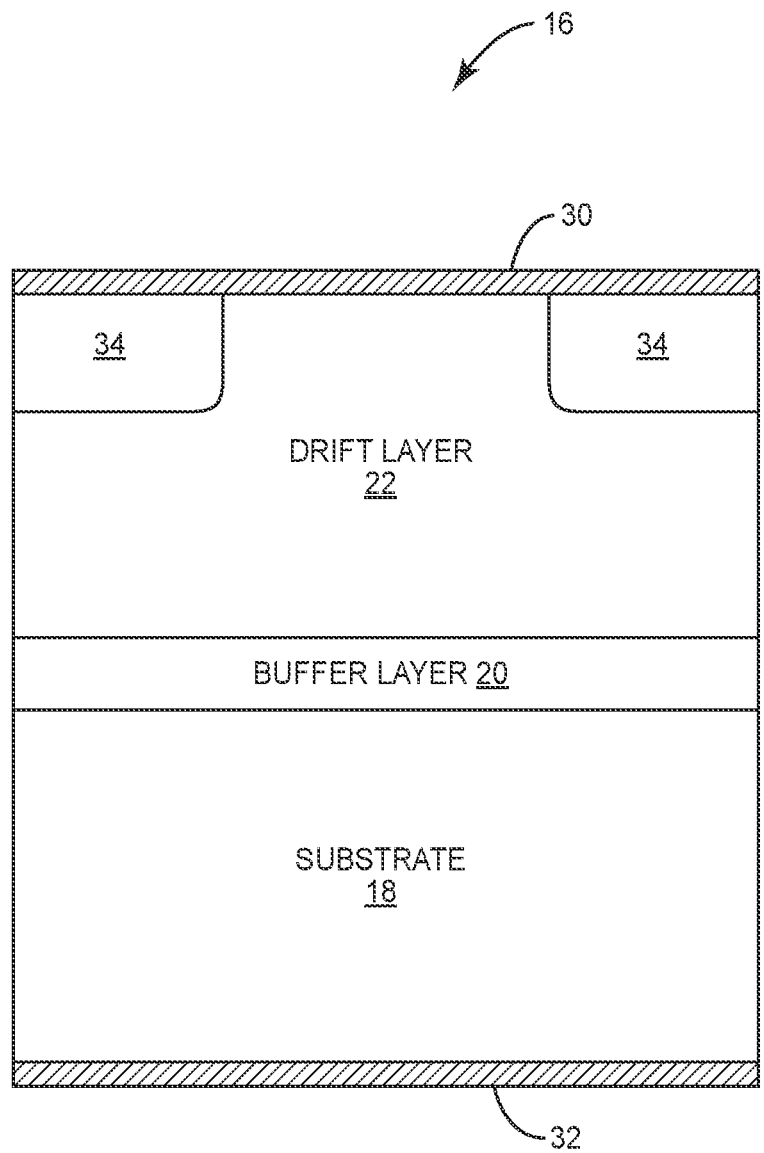
FIG. 10 illustrates a Schottky barrier diode according to one embodiment of the present disclosure.
Figure 11:
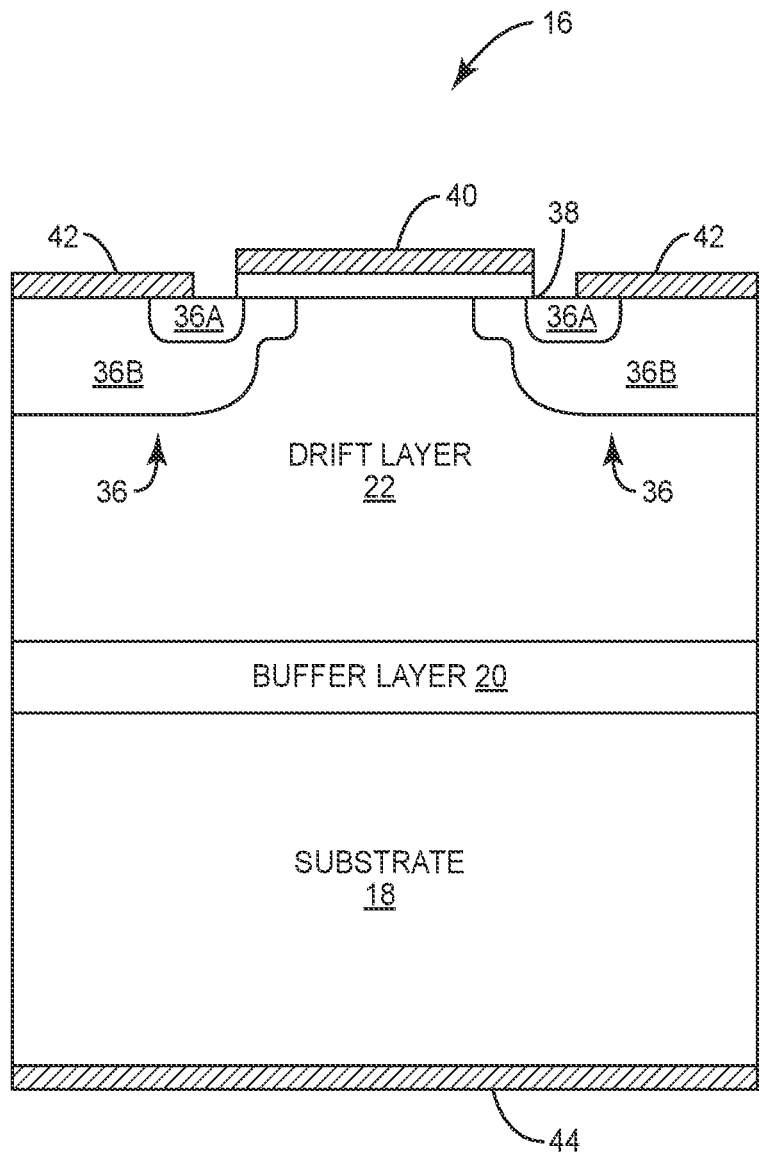
FIG. 11 illustrates a metal-oxide semiconductor field-effect transistor (MOSFET) according to one embodiment of the present disclosure.

As discussed above, a number of implants, additional semiconductor layers, and/or metal layers may determine the device type and thus functionality of the vertical semiconductor device 16. In one embodiment, the vertical semiconductor device 16 is a PiN diode as shown in FIG. 9. Accordingly, the vertical semiconductor device 16 includes a p-layer 24 over the drift layer 22, an anode 26 over the p-layer 24, and a cathode 28 on the substrate 18 opposite the buffer layer 20. In another embodiment, the vertical semiconductor device 16 is a Schottky diode as shown in FIG. 10. Accordingly, the vertical semiconductor device 16 includes an anode 30 over the drift layer 22 and a cathode 32 on the substrate 18 opposite the buffer layer 20. One or more Schottky barrier regions 34 having an opposite doping type to the drift layer may be provided under the anode 30 to create a Schottky barrier diode (SBD). In yet another embodiment, the vertical semiconductor device 16 is a MOSFET as shown in FIG. 11. Accordingly, the vertical semiconductor device 16 includes a pair of junction implant regions 36, which are laterally separated from one another and include a source region 36A and a well region 36B, a gate oxide layer 38 running between the junction implant regions 36, a gate contact 40 over the gate oxide layer 38, a pair of source contacts 42 over a portion of the junction implant regions 36, and a drain contact 44 on the substrate 18 opposite the buffer layer 20. Those skilled in the art will appreciate that additional implanted regions, semiconductor layers, and/or metal layers may be provided to provide any number of different types of semiconductor devices, all of which are contemplated herein.

Figure 12:
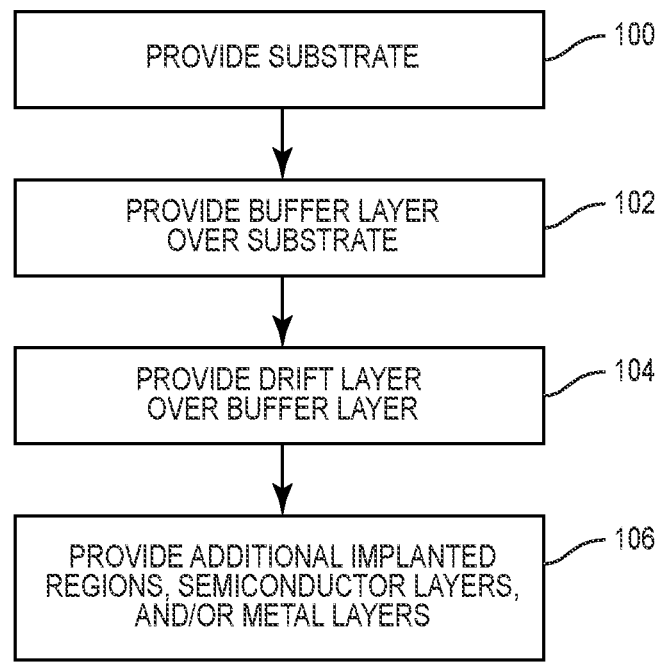
FIG. 12 is a flow chart illustrating a method for manufacturing a vertical semiconductor device according to one embodiment of the present disclosure.

FIG. 12 is a flow diagram illustrating a method for manufacturing a vertical semiconductor device according to one embodiment of the present disclosure. First, a substrate is provided (step 100). The substrate may be silicon carbide (SiC) as discussed above, and has a first doping type and a first doping concentration. A buffer layer is then provided over the substrate (step 102). The buffer layer has the first doping type and a second doping concentration that is less than the first doping concentration. The buffer layer may be epitaxially grown in an environment including dopants designed to create a desired doping profile, or may be grown and subsequently implanted (e.g., via ion implantation) to produce the desired doping profile. A drift layer is then provided over the buffer layer (step 104). The drift layer has the first doping type and a third doping concentration that is less than the second doping concentration. The drift layer may be epitaxially grown over the buffer layer. Finally, one or more additional implanted regions, semiconductor layers, and/or metal layers may be provided in order to provide a semiconductor device of a desired type (step 106). For example, a PiN diode, Schottky diode, MOSFET, or any other type of semiconductor device may be created by providing different implanted regions, semiconductor layers, and/or metal layers.

The following disclosure provides further concepts that achieve radiation hardening for SiC power diodes and MOSFETs. These devices can potentially suffer catastrophic failure from high energy particles (i.e. neutrons, protons, or heavy ions) or energy bombardment (i.e. gamma rays, x-rays) while subjected to high blocking fields. The concepts also support better bipolar switching for most power devices that are switching quickly in a bipolar charge state. The concepts disclosed herein allow diode and MOSFET parts to be operated at higher voltages without the need for de-rating the voltage as is currently done. Devices fabricated from SiC or other semiconductor materials are benefit from these approaches and include, but are not limited to, vertical power diodes, MOSFETs, trench MOSFETs, IGBTs, and the like. Additional embodiments are provided below wherein each of the following embodiments may be implemented as any these device types.

Typically, for better resistance to radiation-induced failure at high operating voltages (high field), it is known that the resistance of the drift layer can be increased by increasing the thickness or decreasing the doping of the drift layer. However, this means that the device will have a higher resistance and thus more power loss in normal use. Similarly, a device can be operated at lower voltages to avoid failure due to radiation, but this voltage limit may render the part unable to be used for the intended application.

It is known that SiC and Si devices can fail due to terrestrial neutron or heavy ion bombardment at high semiconductor fields, but each behave differently. For Si devices, an altering of the drift layer design has been shown to improve radiation tolerance for devices under heavy ion bombardment. Silicon device ruggedness can be correlated to device breakdown, specifically an event termed "second breakdown" which occurs after a device at a high blocking field goes into a bipolar conduction mode. Higher second breakdown voltage onset equates directly to increased device ruggedness under radiation environments.

Research has indicated that a Si device drift design change to keep device resistance constant can increase the second breakdown voltage, but this redesign lowers the avalanche voltage and makes devices more susceptible to other 'typical' modes of failure at high drift fields. Further, device ruggedness relates to the drift punch through voltage (V(PT)), and a drift design which increases the punch through voltage (V(PT)) value improves the high-voltage blocking ruggedness, and reduces switching transients that are harmful for circuits (i.e. diode reverse recovery transients are reduced), and thus increasing this value is also a key factor related to drift ruggedness in general.

In addition, defects in the SiC substrate are known to be able to move basal-plane dislocations into the drift layer if the electric field is able to reach into the substrate while bipolar current is flowing. The following concepts reduce the occurrence of this by not allowing depletion to reach down to the substrate surface.

Notably, Si and SiC semiconductors have key differences, which make design solutions much different. For example, for a given blocking voltage device, the doping levels and thickness of the drift layers 22 will differ by more than an order of magnitude between these materials, and thus unique solutions are needed for SiC-based devices. The bipolar effects involved in this type of breakdown event will be affected by different properties of hole lifetime and mobility in SiC compared to Si. For example, a 1200V vertical power device in SiC has a drift layer on the order of 10 um thick, doped to $1\times10^{16}$ cm$^{-3}$; whereas a Si device would be doped to ~$1\times10^{14}$ cm$^{-3}$ and be ~100 um thick. Thus, the drift design limits for SiC devices is totally different than that of Si devices, and cannot be used it as a reference.

As will become apparent, the following concepts achieve more than an order of magnitude decrease in the radiation failure rate at a given device voltage, while keeping the device resistance effectively unchanged and keeping the avalanche voltage level effectively unchanged. Further, improvements in switching performance are provided due to the disclosed non-punch-through design (NPT).

Typically, SiC-based power devices are designed for the lowest possible resistance, which entails use of a punch-through drift design, wherein the drift layer 22 is fully depleted in blocking, and the electric field takes a trapezoidal form. Thus, the doping level in the drift layer 22 is relatively low, and the thickness is small, thereby providing a low resistance and good blocking voltage. However, the electric field punches through the drift layer 22 at a very low voltage and the bipolar breakdown (i.e. second breakdown) voltage is also low. As such, the power devices can be susceptible to high-field, high-current, and fast switching related failure mechanisms.

Figure 13C:
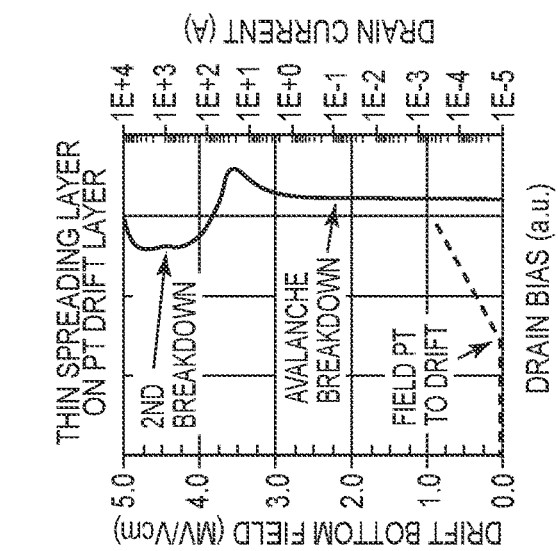
FIG. 13C is graph illustrating the electric field at the bottom of the drift layer and the drain-source current as the drain-source voltage increases in a blocking state for the embodiment of FIG. 13A.
Figure 13B:
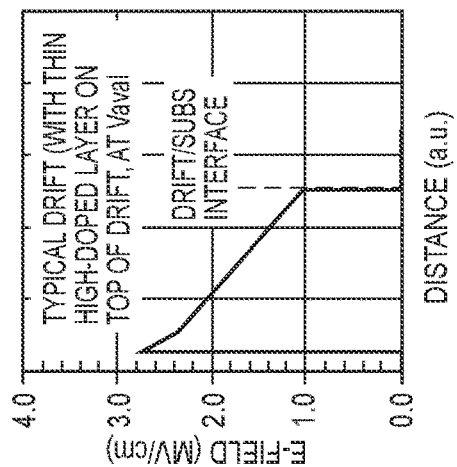
FIG. 13B is a graph illustrating the electric field in the vertical semiconductor device for the embodiment of FIG. 13A.
Figure 13A:
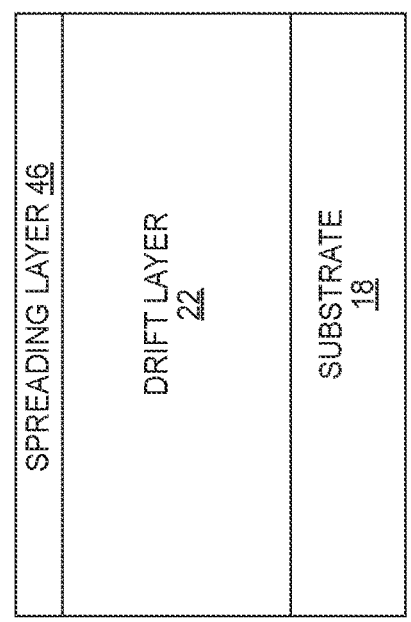
FIG. 13A illustrates a vertical semiconductor device according to one embodiment of the present disclosure.

As illustrated in FIG. 13A, a relatively thin but higher doped spreading layer 46 is provided in certain instances over the drift layer 22 to help the current spread before reaching the lower-doped drift layer 22. As such, a typical SiC or other wide bandgap vertical semiconductor device 16 may have a thin, higher doped top region as the spreading layer 46; a thicker, lower doped drift layer 22, and a relatively this substrate 18, which is shown thin in FIG. 13A to save space. FIG. 13B is a graph of the electric field within the vertical semiconductor versus distance from the top of the vertical semiconductor device 16. At avalanche, the electric field is highest at the top surface of the spreading layer 46 and drops in intensity through the spreading layer 46 and drift layer 22, although at different rates. Notably, the electric field remains at a significant level at the interface of the drift layer 22 and the substrate 18 (i.e. the top surface of the substrate 18). As such, the electric field effectively punches-through (PT) the entire drift layer 22, as illustrated in FIG. 13B. FIG. 13C illustrates that this type of punch through can occur well before avalanche breakdown, and the second breakdown can occur at a lower voltage than avalanche as well, for a structure such as this. In particular, FIG. 13C is a graph showing the electric field at the bottom of the drift layer 22, and the drain-source current (Ids), as the drain-source voltage (Vds) increased in a blocking mode for a FET or diode configuration of the vertical semiconductor device 16. The punch-through voltage V(PT) is observed, as well as the voltages for second breakdown and avalanche breakdown.

Figure 14C:
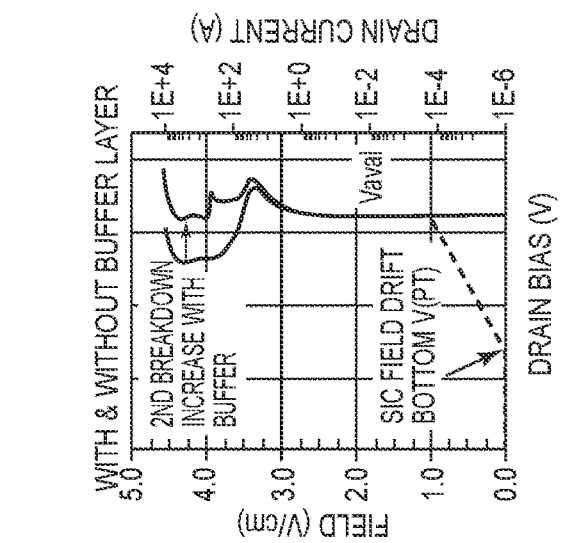
FIG. 14C is graph illustrating the electric field at the bottom of the drift layer and the drain-source current as the drain-source voltage increases in a blocking state for the embodiment of FIG. 14A.
Figure 14B:
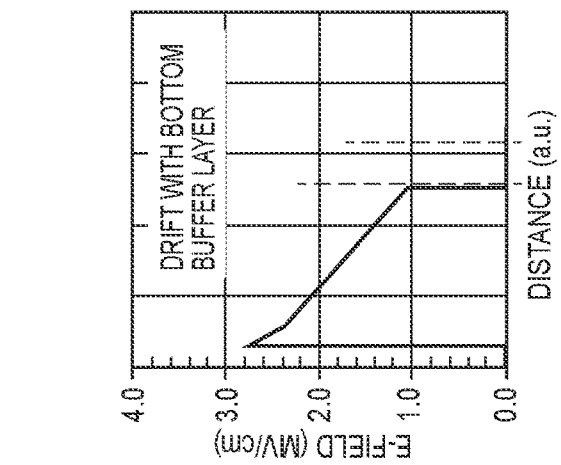
FIG. 14B is a graph illustrating the electric field in the vertical semiconductor device for the embodiment of FIG. 14A.
Figure 14A:
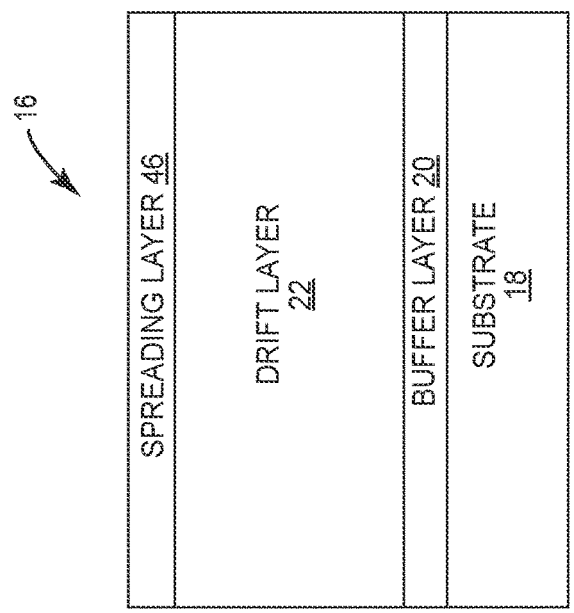
FIG. 14A illustrates a vertical semiconductor device according to one embodiment of the present disclosure.

To avoid or mitigate the punch through of the electric field in to the substrate, a buffer layer 20 may be employed with a spreading layer 46 as illustrated in FIG. 14A. The doping concentration of the buffer layer 20 may be between that of the drift layer 20 and substrate 18. Inclusion of the buffer layer 20 tends to keep the electric field away from the top surface of the substrate 18 and increases the second breakdown voltage. For the illustrated embodiment and as illustrated in FIG. 14B, the electric field at the avalanche voltage punches through the drift layer 22, but is stopped at the buffer layer 20, and as such does not punch through to the substrate 18. Inclusion of the buffer layer 20 increases the second breakdown voltage, which increases ruggedness in high-field bipolar conditions as well as keeps the electric field away from the substrate 18. Keeping the electric field away from the substrate minimizes the effects of basal plane dislocation motion from the substrate 18 into the drift layer 22. FIG. 14C illustrates the electric field at the bottom of the drift layer 22 and the drain-source current (Ids), as the drain-source voltage (Vds) increases in the blocking mode for a FET of diode configuration of the vertical semiconductor device 16. With the buffer layer 20, the avalanche (Vaval) and punch-through voltage V(PT) is unchanged; however, the voltage for second breakdown is significantly increased.

For certain embodiments, the spreading layer 46 will generally range from $1E \times 10^{16}$ to $1 \times 10^{17}$ cm$^{-3}$ in doping level and 1 um-4 um in thickness depending on the desired current and voltage ratings. The doping for the drift layer 22 depends on the voltage rating of the device and can vary from $1 \times 10^{13}$ to $1 \times 10^{17}$ cm$^{-3}$ doping range and from 2 um-300 um in thickness for devices rated from 300V to 300 kV. The buffer layer 20 is generally lower in doping than the substrate 18, which is often doped at $1 \times 10^{18}$ or higher, and is high enough not to significantly deplete in blocking. As such, the buffer layer 20 may range from $1 \times 10^{17}$ up to $5 \times 10^{18}$ cm$^{-3}$ and be 0.5 um to 5 um thick depending on the doping, in order to function as necessary. The thickness of the substrate 18 may range from 50 to 500 micrometers. The concept associated with the embodiment of FIG. 14A adds very little resistance to the structure, but aids in ruggedness performance.

Alternative doping concentration ranges for the embodiment of FIG. 14A includes:
  from $1 \times 10^{16}$ to $5 \times 10^{16}$ cm$^{-3}$ for the spreading layer 46;
  from $1 \times 10^{13}$ to $1 \times 10^{17}$ cm$^{-3}$ for the drift layer 22;
  from $5 \times 10^{16}$ to $5 \times 10^{18}$ cm$^{-3}$ for the buffer layer 20; and
  from $5 \times 10^{17}$ to $1 \times 10^{20}$ cm$^{-3}$ for the substrate 18.

Figure 15C:
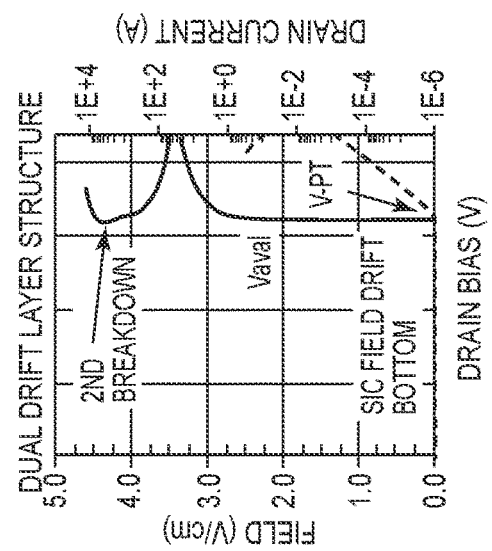
FIG. 15C is graph illustrating the electric field at the bottom of the drift layer and the drain-source current as the drain-source voltage increases in a blocking state for the embodiment of FIG. 15A.
Figure 15B:
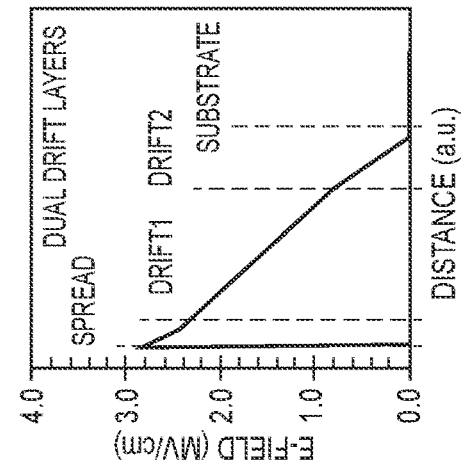
FIG. 15B is a graph illustrating the electric field in the vertical semiconductor device for the embodiment of FIG. 15A.
Figure 15A:
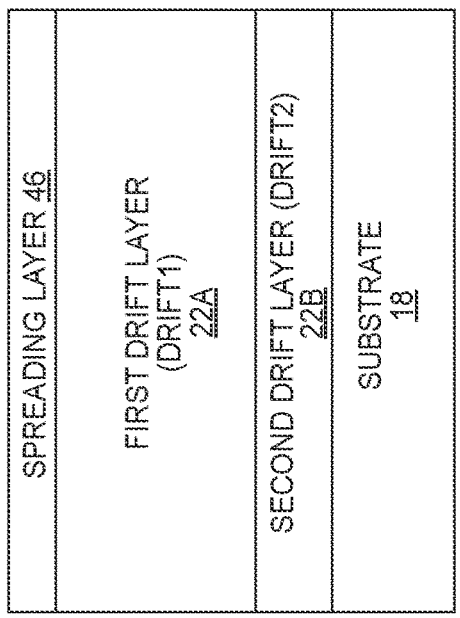
FIG. 15A illustrates a vertical semiconductor device according to one embodiment of the present disclosure.

In the embodiment of FIG. 15A, multiple drift layers are provided in the vertical semiconductor device 16 and referenced as an upper, first drift layer 22A and a lower, second drift layer 22B. No buffer layer 20 is included. The first drift layer 22A resides between the spreading layer 46 and the second drift layer 22B. The second drift layer 22B resides between the first drift layer 22A and the substrate 18.

The lower, second drift layer 22B may have a doping level slightly higher than the upper, first drift layer 22A in an effort to thicken the drift from the prior embodiments. Further, first drift layer 22A can be thinner than the drift layer 22 of embodiment in FIG. 14A while having a slightly higher doping level to keep overall drift resistance low. Relative to the previous embodiment, these changes increase both the punch through voltage (V(PT)) and second breakdown voltage.

In certain embodiments, the second drift layer 22B may have a doping level that is one to three times that of the first drift layer 22A while being any thickness near or less than that of the first drift layer 22A. This embodiment provides increased ruggedness by not allowing as high of an electric field to penetrate into the substrate 18. In select embodiments, the first and second drift layers 22A, 22B of the vertical semiconductor device 16 can be designed to prevent any electric field from punching through the second drift layer 22B into the substrate 18, as shown in FIG. 15B. FIG. 15B illustrates the electric fields in the vertical semiconductor device 16 at the avalanche voltage. Notably, the electric field is stopped in the second drift layer 22B just shy of the substrate 18.

FIG. 15C illustrates the electric field at the bottom of the second drift layer 22B and the drain source current (Ids), as the drain-source voltage (Vds) increases in the blocking mode for a FET or diode configuration of the vertical semiconductor device 16. With the addition of the lower, second drift layer 22B, the avalanche voltage (Vaval) can be kept constant, while both the punch-through voltage V(PT) and the second breakdown voltage is increased beyond the avalanche voltage (Vaval).

The use of multiple drift layers, such as the first and second drift layers 22A, 22B can aid in overall device ruggedness under high field, high current, and fast switching conditions. Snappiness in switching is reduced and electric fields are kept out of the substrate 18 so that the basal plane dislocations will not move into the first or second drift layers 22A, 22B. More than two drift layers may be used to achieve similar results.

Exemplary doping concentration ranges for the embodiment of FIG. 15A includes:
  from $1 \times 10^{16}$ to $5 \times 10^{16}$ cm$^{-3}$ for the spreading layer 46;
  from $1 \times 10^{13}$ to $4 \times 10^{16}$ cm$^{-3}$ for the first drift layer 22A;
  from $2 \times 10^{13}$ to $8 \times 10^{16}$ cm$^{-3}$ for the second drift layer 22B; and
  from $5 \times 10^{17}$ to $1 \times 10^{20}$ cm$^{-3}$ for the substrate 18.
An alternative set of ranges includes:
  from $1 \times 10^{16}$ to $5 \times 10^{16}$ cm$^{-3}$ for the spreading layer 46;
  from $1 \times 10^{15}$ to $2 \times 10^{16}$ cm$^{-3}$ for the first drift layer 22A;
  from $2 \times 10^{15}$ to $3 \times 10^{16}$ cm$^{-3}$ for the second drift layer 22B; and
  from $1 \times 10^{18}$ to $1 \times 10^{20}$ cm$^{-3}$ for the substrate 18.
Exemplary thickness ranges include:
  1-4 micrometers for the spreading layer 46;
  2-50 micrometers for the first drift layer 22A;
  1-30 micrometers for the second drift layer 22B; and
  50-500 micrometers for the substrate 18.

Figures 16A, 16B, 16C:
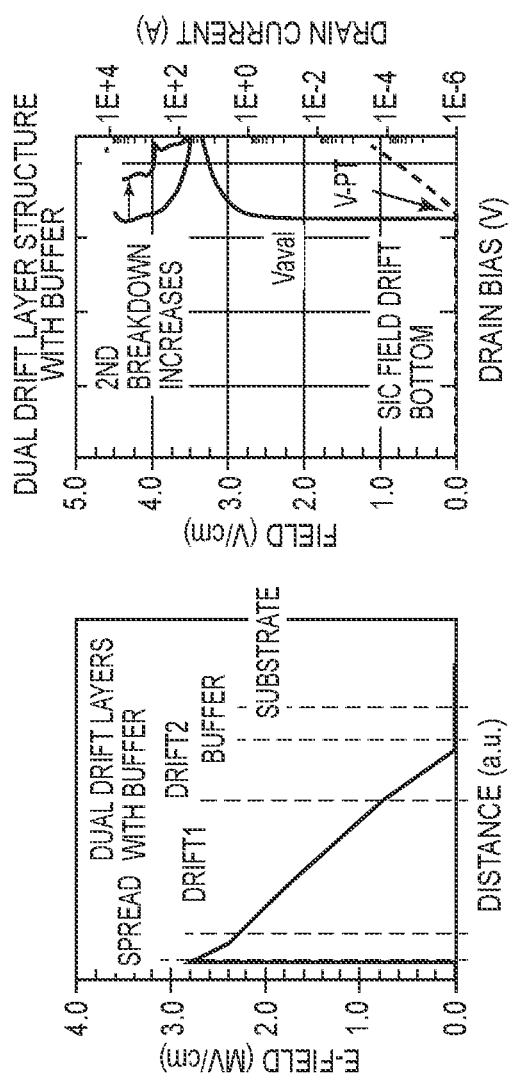
FIG. 16A illustrates a vertical semiconductor device according to one embodiment of the present disclosure.
FIG. 16B is a graph illustrating the electric field in the vertical semiconductor device for the embodiment of FIG. 16A.
FIG. 16C is graph illustrating the electric field at the bottom of the drift layer and the drain-source current as the drain-source voltage increases in a blocking state for the embodiment of FIG. 16A.

The embodiment illustrated in FIG. 16A builds on that of FIG. 15A by adding a buffer layer 20 between the second drift layer 22B and the substrate 18. As with the prior embodiment, the electric field at the avalanche voltage does not punch through second drift layer 22B, and as such is stopped shy of the buffer layer 20, as shown in FIG. 16B. The additional benefits of this embodiment become more readily apparent in FIG. 16C. FIG. 16C illustrates the electric field at the bottom of the drift layer 22B and the Ids current as the drain-source voltage (Vds) increases in the blocking mode when the vertical semiconductor device 16 is configured as a FET or diode. With the added buffer layer 20, the avalanche voltage (Vaval) and the punch-through voltage (V(PT)) are kept relatively constant, while the second breakdown voltage is further increased to provide additional field lowering in high field, high current discharge conditions.

Exemplary doping concentration ranges for the embodiment of FIG. 16A includes:
  from $1 \times 10^{16}$ to $5 \times 10^{16}$ cm$^{-3}$ for the spreading layer 46;
  from $1 \times 10^{13}$ to $5 \times 10^{16}$ cm$^{-3}$ for the first drift layer 22A;
  from $2 \times 10^{13}$ to $1 \times 10^{17}$ cm$^{-3}$ for the second drift layer 22B;
  from $5 \times 10^{16}$ to $5 \times 10^{18}$ cm$^{-3}$ for the buffer layer 46; and
  from $1 \times 10^{18}$ to $1 \times 10^{20}$ cm$^{-3}$ for the substrate 18.
An alternative set of ranges includes:
  from $1 \times 10^{16}$ to $5 \times 10^{16}$ cm$^{-3}$ for the spreading layer 46;
  from $1 \times 10^{15}$ to $2 \times 10^{16}$ cm$^{-3}$ for the first drift layer 22A;
  from $2 \times 10^{15}$ to $3 \times 10^{16}$ cm$^{-3}$ for the second drift layer 22B;
  from $1 \times 10^{17}$ to $1 \times 10^{18}$ cm$^{-3}$ for the buffer layer 46; and
  from $1 \times 10^{18}$ to $1 \times 10^{20}$ cm$^{-3}$ for the substrate 18.

Exemplary thickness ranges include:
- 1-5 micrometers for the spreading layer 46;
- 2-50 micrometers for the first drift layer 22A;
- 1-30 micrometers for the second drift layer 22B;
- 1-20 micrometers for the buffer layer 46; and
- 50-500 micrometers for the substrate 18.

The first and second drift layers 22A and 22B may have the same or different doping concentrations as well as the same or different doping profiles. For example, both the first and second drift layers 22A and 22B may have graded or fixed doping concentrations that are the same or different. Further, either one of the first and second drift layers 22A and 22B may have a graded doping profile while the other one is fixed. In certain embodiments, the spreading layer has a higher doping concentration than at least one, if not both, of the first and second drift layers.

Figures 17A, 17B, 17C:
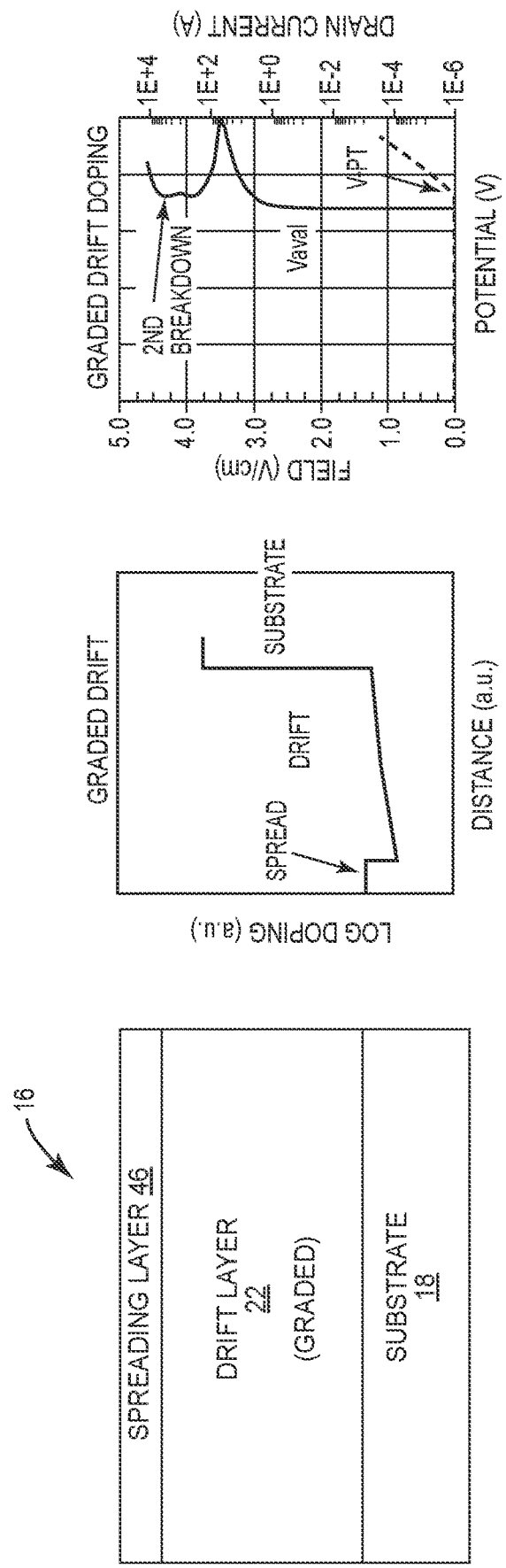
FIG. 17A illustrates a vertical semiconductor device according to one embodiment of the present disclosure.
FIG. 17B is a graph illustrating the relative graded doping centration levels throughout the various layers of the vertical semiconductor device for the embodiment of FIG. 17A.
FIG. 17C is graph illustrating the electric field at the bottom of the drift layer and the drain-source current as the drain-source voltage increases in a blocking state for the embodiment of FIG. 17A.

The embodiment of FIG. 17A provides a vertical semiconductor device 16 with a drift layer 22 with graded doping. In the illustrated embodiment, there is only one drift layer 22 and no buffer layer 20. The doping concentration increases in the drift layer 22 from the bottom (i.e. substrate interface) to the top (i.e. spreading layer 46 interface) of the drift layer 22. As such, the doping concentration is slightly higher at the bottom of the drift layer 22 and lower near the top of the drift layer 22. As illustrated in FIG. 17B, the doping concentration is relatively level throughout the spreading layer 46, drops to a first level at the top of the drift layer 22, increases continuously throughout the drift layer 22 to a level at or below the spreading layer 46, and jumps up to a much higher and relatively fixed level in the substrate 18. The doping concentrations in FIG. 17B are shown on a log scale.

With the right doping concentration, profile, and thickness, an increase in both the punch through voltage (V(PT)) and the second breakdown voltage is provided, as illustrated in FIG. 17C. With the graded drift layer 22, the avalanche voltage (Vaval) can be kept constant, while the second breakdown voltage and the punch-through voltage V(PT) is increased beyond the avalanche voltage (Vaval) limit. This provides additional field lowering in high field, high current discharge conditions.

Ruggedness under high field, high current, and fast switching conditions is increased by not allowing any or as high of a field to penetrate into the substrate 18. Bipolar device snappiness in switching is also reduced. As in the other embodiments, keeping the electric fields out of the substrate 18 prevents basal plane dislocations from moving into the drift layer 22.

Exemplary doping concentration ranges for the embodiment of FIGS. 17A and 17B includes:
- from $1 \times 10^{-16}$ to $5 \times 10^{-16}$ cm$^{-3}$ for the spreading layer 46;
- from between $1 \times 10^{-13}$ and $5 \times 10^{-18}$ cm$^{-3}$ to between_1E15_$\times 10^{-X}$ and_5E17_$\times 10^{-X}$ cm$^{-3}$ for the drift layer 22; and
- from $1 \times 10^{-18}$ to $1 \times 10^{-20}$ cm$^{-3}$ for the substrate 18.

An alternative set of ranges includes:
- from $1 \times 10^{-16}$ to $5 \times 10^{-16}$ cm$^{-3}$ for the spreading layer 46;
- from between $5 \times 10^{-15}$ and $5 \times 10^{-17}$ cm$^{-3}$ to between $1 \times 10^{-16}$ and $1 \times 10^{-17}$ cm$^{-3}$ for the drift layer 22; and
- from $1 \times 10^{-18}$ to $5 \times 10^{-19}$ cm$^{-3}$ for the substrate 18.

Exemplary thickness ranges include:
- 1-5 micrometers for the spreading layer 46;
- 3-200 micrometers for the drift layer 22; and
- 50-500 micrometers for the substrate 18.

Figure 19:
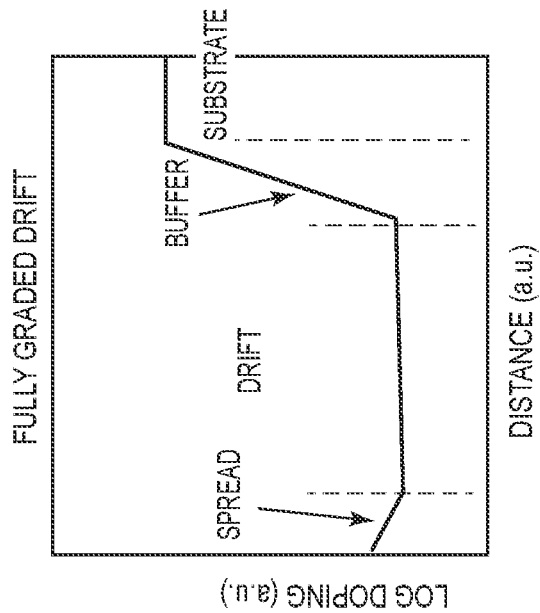
FIG. 19 is a graph illustrating the relative graded doping centration levels throughout the various layers of the vertical semiconductor device for the embodiment of FIG. 18.
Figure 18:
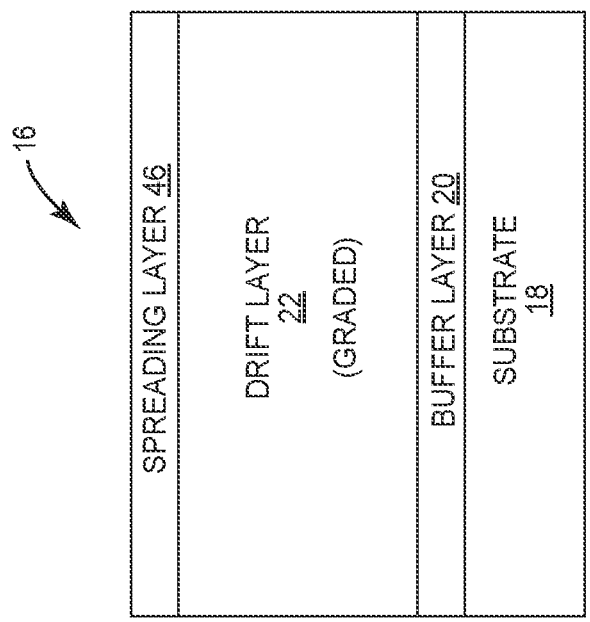
FIG. 18 illustrates a vertical power device according to one embodiment of the present disclosure.

Turning now to FIG. 18, a buffer layer 20 and graded drift layer 22 are provided between the spreading layer 46 and the substrate 18. In this embodiment, the spreading layer 46 and the buffer layer 20 are uniformly doped and the drift layer 22 is graded as described above. In other embodiments, the doping for the spreading layer 46 and/or the buffer layer 20 is graded. The graph off FIG. 19 provides an exemplary doping profile on a log scale. As illustrated in FIG. 17B, the doping concentration decreases continuously from a first level at the top of the spreading layer 46 to a second level at the bottom of the spreading layer 46; increases continuously from the second level at the top of the drift layer 22 to a third level, which is lower than the first level, at the bottom of the drift layer 22; increases continuously from the second level throughout the buffer layer 20 to a fourth level. The doping throughout the substrate 18 is shown to be uniform at the fourth level. In the illustrated embodiment, the doping levels throughout the illustrated layers are continuous in that there are no abrupt changes in doping concentrations within a given layer or at the junction of layers.

Exemplary doping concentration ranges for a fully graded embodiment includes:
- from between $5 \times 10^{-16}$ and $1 \times 10^{-14}$ cm$^{-3}$ to between $3 \times 10^{-16}$ and $5 \times 10^{-15}$ cm$^{-3}$ for the spreading layer 46;
- from between $1 \times 10^{-13}$ and $1 \times 10^{-17}$ cm$^{-3}$ to between $5 \times 10^{-15}$ and $5 \times 10^{-16}$ cm$^{-3}$ for the drift layer 22;
- from between $5 \times 10^{-16}$ and $1 \times 10^{-20}$ cm$^{-3}$ to $1 \times 10^{-17}$ and $1 \times 10^{-20}$ cm$^{-3}$ for the buffer layer 20; and
- from $1 \times 10^{-18}$ to $1 \times 10^{-20}$ cm$^{-3}$ for the substrate 18.

Exemplary thickness ranges include:
- 1-5 micrometers for the spreading layer 46;
- 3-200 micrometers for the drift layer 22;
- 1-20 micrometers for the buffer layer 20; and
- 50-500 micrometers for the substrate 18.

The characteristics, thicknesses, doping concentrations, relationships of the thicknesses and/or doping concentrations and the like for the substrate 18, buffer layer 20, and drift layer 22 for the embodiments of FIGS. 3 through 12 may, but need not, be applied to any of the embodiments of FIGS. 13 through 19, and vice versa.

Any of the above vertical semiconductor embodiments can be implemented as any of the previously identified vertical semiconductor components by adding the contacts (30, 32, 40, 42, 44) and appropriate doping regions/implants (34, 36A, 36B) as identified in FIGS. 10 and 11, wherein the doping regions will extend into one or more of the spreading layer 46, drift layer 22, first drift layer 22A, and/or second drift layer 22B. Those skilled in the art will recognize improvements and modifications to the preferred embodiments of the present disclosure. All such improvements and modifications are considered within the scope of the concepts disclosed herein and the claims that follow.

What is claimed is:

1. A vertical semiconductor device comprising:
   a substrate having a first doping type;
   a drift layer on the substrate and having the first doping type and a graded doping profile; and
   a spreading layer on the drift layer and having the first doping type, wherein the substrate, the spreading layer, and the drift layer comprise silicon carbide.

2. The vertical semiconductor device of claim 1 wherein the graded doping profile increases continuously through the drift layer from the spreading layer to the substrate.

3. The vertical semiconductor device of claim 2 wherein a doping profile of the spreading layer is uniform throughout the spreading layer.

4. The vertical semiconductor device of claim 3 wherein a maximum doping concentration of the spreading layer is higher than a maximum doping concentration of the drift layer.

5. The vertical semiconductor device of claim 1 wherein a doping concentration of the substrate is higher than a maximum doping concentration of the drift layer.

6. The vertical semiconductor device of claim 5 wherein a range of doping concentrations for the graded doping profile falls between $1\times10^{13}$ cm$^{-3}$ and $1\times10^{18}$ cm$^{-3}$.

7. The vertical semiconductor device of claim 5 wherein a thickness of the drift layer is between 3 and 50 micrometers.

8. The vertical semiconductor device of claim 5 wherein there is no buffer layer between the substrate and the drift layer.

9. The vertical semiconductor device of claim 5 wherein:
the graded doping profile increases continuously through the drift layer from the spreading layer to the substrate;
a doping concentration of the spreading layer is uniform throughout the spreading layer;
a maximum doping concentration of the spreading layer is higher than the maximum doping concentration of the drift layer; and
there is no buffer layer between the substrate and the drift layer.

10. The vertical semiconductor device of claim 5 wherein a range of doping concentrations for the graded doping profile falls between $1\times10^{13}$ cm$^{-3}$ and $5\times10^{18}$ cm$^{-3}$.

11. A vertical semiconductor device comprising:
a substrate having a first doping type;
a buffer layer on the substrate and having the first doping type;
a drift layer on the buffer layer and having the first doping type and a graded doping profile; and
a spreading layer on the drift layer and having the first doping type, wherein the substrate, the buffer layer, the spreading layer, and the drift layer comprise silicon carbide.

12. The vertical semiconductor device of claim 11 wherein the graded doping profile increases continuously through the drift layer from the spreading layer to the substrate.

13. The vertical semiconductor device of claim 12 wherein a doping concentration of the spreading layer is uniform throughout the spreading layer.

14. A vertical semiconductor device comprising:
a substrate having a first doping type;
a buffer layer on the substrate and having the first doping type;
a drift layer on the buffer layer and having the first doping type and a graded doping profile; and
a spreading layer on the drift layer and having the first doping type, wherein the substrate, the buffer layer, and the drift layer comprise silicon carbide,
wherein a maximum doping concentration of the spreading layer is higher than a maximum doping concentration of the drift layer, and
wherein a doping concentration of the substrate is higher than a doping concentration of the drift layer.

15. The vertical semiconductor device of claim 11 wherein a range of doping concentrations for the graded doping profile falls between $1\times10^{13}$ cm$^{-3}$ and $1\times10^{17}$ cm$^{-3}$.

16. The vertical semiconductor device of claim 15 wherein a thickness of the drift layer is between 3 and 50 micrometers.

17. The vertical semiconductor device of claim 11 wherein:
the graded doping profile increases continuously through the drift layer from the spreading layer to the substrate;
a doping concentration of the spreading layer is uniform throughout the spreading layer; and
a maximum doping concentration of the spreading layer is higher than a maximum doping concentration of the drift layer.

18. The vertical semiconductor device of claim 11 wherein a doping concentration of the buffer layer is at least ten times an average doping concentration of the drift layer.

19. The vertical semiconductor device of claim 11 wherein a doping concentration of the buffer layer is between ten and thirty times an average doping concentration of the drift layer.

20. The vertical semiconductor device of claim 11 wherein a doping concentration of the buffer layer is between fifteen and twenty-five times an average doping concentration of the drift layer.

21. The vertical semiconductor device of claim 11 wherein a thickness of the buffer layer is between ten and thirty percent of a thickness of the drift layer.

22. The vertical semiconductor device of claim 11 wherein a thickness of the buffer layer is between fifteen and twenty-five percent of a thickness of the drift layer.

23. The vertical semiconductor device of claim 11 wherein:
a doping concentration of the buffer layer is between ten and thirty times an average doping concentration of the drift layer; and
a thickness of the buffer layer is between ten and thirty percent of a thickness of the drift layer.

24. The vertical semiconductor device of claim 23 wherein the spreading layer has a doping concentration between two and one thousand times that of the average doping concentration of the drift layer.

25. The vertical semiconductor device of claim 23 wherein a thickness of the spreading layer is less than a thickness of the drift layer.

26. The vertical semiconductor device of claim 11 wherein:
the graded doping profile increases continuously through the drift layer from the spreading layer to the substrate;
a graded doping profile for the spreading layer decreases continuously through the spreading layer from a top portion of the spreading layer to the drift layer; and
a graded doping profile for the buffer layer increases continuously through the buffer layer from the spreading layer to the substrate.

27. The vertical semiconductor device of claim 26 wherein a maximum doping concentration of the spreading layer is higher than a maximum doping concentration of the drift layer.

28. The vertical semiconductor device of claim 11 wherein a doping concentration of the substrate is higher than a doping concentration of the drift layer.

* * * * *